(12) United States Patent
Kuramoto et al.

(10) Patent No.: US 6,809,351 B2
(45) Date of Patent: Oct. 26, 2004

(54) GROUP III-V COMPOUND SEMICONDUCTOR CRYSTAL STRUCTURE AND METHOD OF EPITAXIAL GROWTH OF THE SAME AS WELL AS SEMICONDUCTOR DEVICE INCLUDING THE SAME

(75) Inventors: Masaru Kuramoto, Tokyo (JP); Haruo Sunakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/091,437

(22) Filed: Mar. 7, 2002

(65) Prior Publication Data

US 2002/0168844 A1 Nov. 14, 2002

(30) Foreign Application Priority Data

Mar. 7, 2001 (JP) .......................... 2001-063688

(51) Int. Cl.[7] ............... H01L 31/0328; H01L 31/0336; H01L 31/072; H01L 31/109
(52) U.S. Cl. ................... 257/190; 257/11; 257/189; 257/613; 257/615
(58) Field of Search ................ 257/11, 189, 190, 257/613, 615

(56) References Cited

U.S. PATENT DOCUMENTS

| | | | | |
|---|---|---|---|---|
| 3,997,368 A | * | 12/1976 | Petroff et al. | 438/476 |
| 4,999,314 A | * | 3/1991 | Pribat et al. | 438/481 |
| 5,019,874 A | * | 5/1991 | Inoue et al. | 257/190 |
| 5,569,954 A | | 10/1996 | Hata et al. | |
| 6,015,979 A | * | 1/2000 | Sugiura et al. | 257/86 |
| 6,225,650 B1 | * | 5/2001 | Tadatomo et al. | 257/190 |
| 6,252,261 B1 | * | 6/2001 | Usui et al. | 257/190 |
| 6,294,440 B1 | * | 9/2001 | Tsuda et al. | 438/479 |
| 6,312,967 B1 | * | 11/2001 | Ikeda | 438/22 |
| 6,413,627 B1 | * | 7/2002 | Motoki et al. | 428/332 |
| 6,420,198 B1 | * | 7/2002 | Kimura et al. | 438/22 |
| 6,635,110 B1 | * | 10/2003 | Luan et al. | 117/4 |
| 2001/0008285 A1 | * | 7/2001 | Tsujimura et al. | 257/103 |

FOREIGN PATENT DOCUMENTS

| | | |
|---|---|---|
| JP | A 10-312971 | 11/1998 |
| JP | A 11-251253 | 9/1999 |
| JP | A 2000-12976 | 1/2000 |
| JP | A 2000-21789 | 1/2000 |
| JP | A 2000-91253 | 3/2000 |
| JP | A 2000-101194 | 4/2000 |
| JP | A 2001-48694 | 2/2001 |
| TW | 451308 | 8/2001 |

OTHER PUBLICATIONS

*Applied Physics*, V. 68, 1999, pp. 774–779 (with English abstract).
Keisaku Kimura et al., "Vibronic Fine Structure Found in the Blue Luminescence from Silicon Nanocolloids," *Jpn. J. Appl. Phys.*, V. 38, 1999, pp. 609–612.

* cited by examiner

*Primary Examiner*—Amir Zarabian
*Assistant Examiner*—Ida M. Soward
(74) *Attorney, Agent, or Firm*—Young & Thompson

(57) ABSTRACT

A Group III-V compound semiconductor epitaxial layer has a tilt angle of at most 100 seconds and/or a tilt angle of at most 100 seconds. The layer is epitaxially grown by use of a mask, wherein the mask satisfies the equation (1):

$$h \geq (w/2)\tan\theta \qquad (1)$$

where "θ" is a base angle of a facet structure of the Group III-V compound semiconductor layer on the epitaxial growth; "h" is a thickness of the mask; and "w" is an opening width of the mask at its lower level, and the opening width is defined in a direction included in a plane which is vertical to both the surface of the base layer and the side face of the facet structure.

14 Claims, 43 Drawing Sheets

GROUP III-V COMPOUND SEMICONDUCTOR CRYSTAL STRUCTURE AND METHOD OF EPITAXIAL GROWTH OF THE SAME AS WELL AS SEMICONDUCTOR DEVICE INCLUDING THE SAME

BACKGROUND OF THE INVENTION

1. Field of the Invention

The present invention relates to a Group III-V compound semiconductor crystal structure, and a method of epitaxial growth of a Group III-V compound semiconductor crystal structure, as well as a semiconductor device over a Group III-V compound semiconductor substrate.

2. Description of the Related Art

It is preferable to grow an epitaxial layer on a base material or a substrate which comprises the same bulk semiconductor crystal as the epitaxial layer, wherein the base material is identical with the epitaxial layer in physical properties such as lattice constant and thermal expansion coefficient. This results in a reduced crystal defect of the epitaxial layer and also improves the quality of the epitaxial layer.

A gallium nitride based bulk crystal has a high dissociation pressure of nitrogen, for which reason it is generally difficult to prepare a large size wafer of the gallium nitride based bulk crystal. The gallium nitride based bulk crystal generally has a low electron mobility in the range of about 30–90 cm$^2$/Vs due to a relatively high impurity concentration.

The present inventors had prepared the gallium nitride based semiconductor substrate in a conventional method which is disclosed in Japanese laid-open patent publication No. 11-251253. FIGS. 1A through 1E are fragmentary cross sectional elevation views of semiconductor substrates including gallium nitride base layers in sequential steps involved in the conventional methods.

With reference to FIG. 1A, a GaN film 112 having a thickness of 1.2 micrometers is formed on a (0001)-face of a sapphire substrate 111. An SiO$_2$ film is formed on a surface of the GaN film 112. A photo-lithography process and a subsequent wet etching to the SiO$_2$ film are carried out for forming silicon oxide masks 114. The silicon oxide masks 114 cover parts of the surface of the GaN film 112. Uncovered parts of the surface of the GaN film 112 are growth areas 113. The growth areas 113 are stripe-shaped in a width of 5 micrometers. The silicon oxide masks 114 are also stripe-shaped in a width of 2 micrometers. The stripe-shaped growth areas 113 and silicon oxide masks 114 have a longitudinal direction <11–20>.

With reference to FIG. 1B, a GaN film 115 is grown on the growth areas 113 by a hydride vapor phase epitaxy (HVPE) which uses gallium chloride (GaCl) and ammonium (NH$_3$) as Group-V source material. Gallium chloride (GaCl) is produced by reaction of gallium as group-III element, and hydrogen chloride (HCl). Dichlorosilane (SiH$_2$Cl$_2$) is used as an n-type dopant. The substrate 111 is set in a growth chamber. A temperature is increased up to a growth temperature of 1000° C. in a hydrogen atmosphere. After the temperature becomes stable at the growth temperature, then hydrogen chloride (HCl) is supplied at a flow rate of 20 cc/min for 5 minuets, whereby GaN films 115 are grown on the growth areas 113, wherein the GaN films 115 have a (1–101)-facet structure.

With reference to FIGS. 1C through 1E, feeding dichlorosilane (SiH$_2$Cl$_2$) as the n-type dopant is still continued to further grow up the GaN films 115 until a thickness of the GaN films 115 becomes 100 micrometers. The crystal growth based on the (1–101)-facet makes the GaN films 115 grown over the masks 114 in the lateral direction. This is so called as an epitaxial lateral overgrowth. This growth method allows obtaining a crack-free wafer of 2-inches size including a GaN film of a few hundreds thickness. The obtained wafer has a reduced dislocation density and a doping concentration of 5E17/cm$^3$ and a mobility of about 800 cm$^2$/V.

Even the dislocation density is reduced by using the epitaxial lateral overgrowth but still be about 1E7/cm$^3$. This dislocation density means that the GaN film has a prismatic-shaped micro crystal structure including a large number of prismatic-shaped micro-crystal grains. This prismatic-shaped micro crystal structure has a tilt toward an c-axis of the crystal structure and a twist in a c-plane thereof. For this reason, the GaN film has a mosaic crystal structure which may generally cause deterioration in electrical and optical properties.

The tilt angle and the twist angle may be measured by using an X-ray. If a single GaN film having a thickness of 1.2 micrometers is grown on a low temperature buffer layer over a sapphire substrate without using the epitaxial lateral overgrowth, then the measured tilt angle of the GaN film is 324 seconds, and the measured twist angle is 1188 seconds. If a GaN film having a thickness of 140 micrometers is grown on the sapphire substrate by using the epitaxial lateral overgrowth, then the measured tilt angle of the GaN film is 180 seconds, and the measured twist angle is 208 seconds.

The use of the epitaxial lateral overgrowth results in a certain improvement in the crystal quality of the gallium nitride based layer. Notwithstanding, the tilt angle and the twist angle of the crystal structure of the gallium nitride based semiconductor layer are still larger than when the gallium nitride based layer is grown over a GaAs substrate or an InP substrate.

For further improvement in the electrical and optical characteristics of the semiconductor device, it is desirable to further reduce the tilt angle and the twist angle of the crystal structure of the gallium nitride based semiconductor layer.

SUMMARY OF THE INVENTION

Accordingly, it is an object of the present invention to provide a novel method of forming a Group III-V compound semiconductor layer free from the above problems.

It is a further object of the present invention to provide a novel method of forming a Group III-V compound semiconductor layer with a highly perfection of crystal structure.

It is a still further object of the present invention to provide a novel Group III-V compound semiconductor layer free from the above problems.

It is yet a further object of the present invention to provide a novel Group III-V compound semiconductor layer with a highly perfection of crystal structure.

It is a still further object of the present invention to provide a novel semiconductor device including a Group III-V compound semiconductor layer free from the above problems.

It is yet a further object of the present invention to provide a novel semiconductor device including a Group III-V compound semiconductor layer with a highly perfection of crystal structure.

It is a still further object of the present invention to provide a novel semiconductor substrate with an upper surface comprising a Group III-V compound semiconductor layer free from the above problems.

It is yet a further object of the present invention to provide a novel semiconductor substrate with an upper surface comprising a Group III-V compound semiconductor layer with a highly perfection of crystal structure.

The present invention provides a method of forming a Group III-V compound semiconductor layer. The method comprises the step of: carrying out an epitaxial growth of a Group III-V compound semiconductor layer over a base layer having a crystal structure by use of a mask, wherein the mask satisfies the equation (1):

$$h \geq (w/2)\tan\theta \quad (1)$$

where "θ" is a base angle of a facet structure of the Group III-V compound semiconductor layer on the epitaxial growth; "h" is a thickness of the mask; and "w" is an opening width of the mask at its lower level, and the opening width is defined in a direction included in a plane which is vertical to both the surface of the base layer and the side face of the facet structure.

The present invention also provides a Group III-V compound semiconductor epitaxial layer having an upper region which has a crystal structure with a tilt angle of at most 100 seconds and/or a tilt angle of at most 100 seconds.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
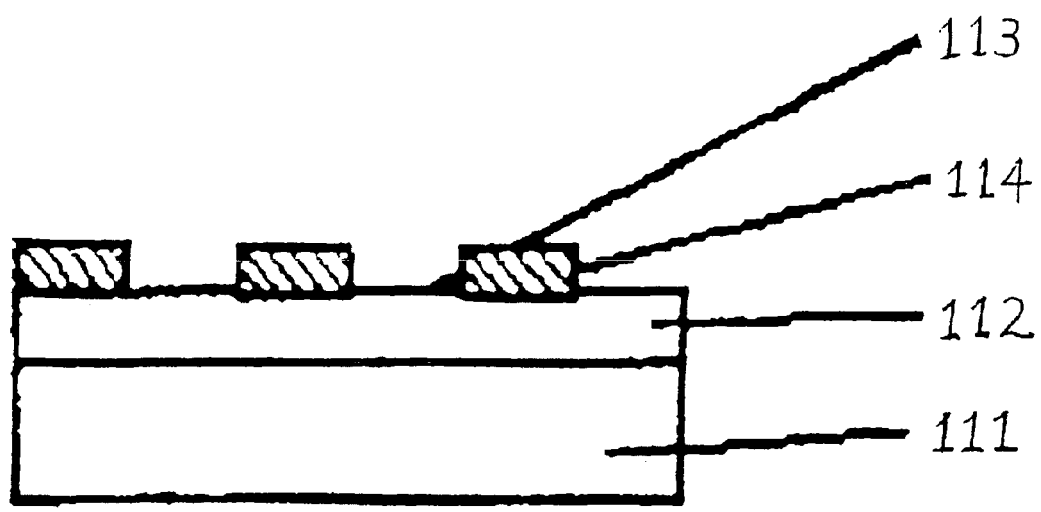
FIGS. 1A through 1E are fragmentary cross sectional elevation views of semiconductor substrates including gallium nitride base layers in sequential steps involved in the conventional methods.
Figure 1B:
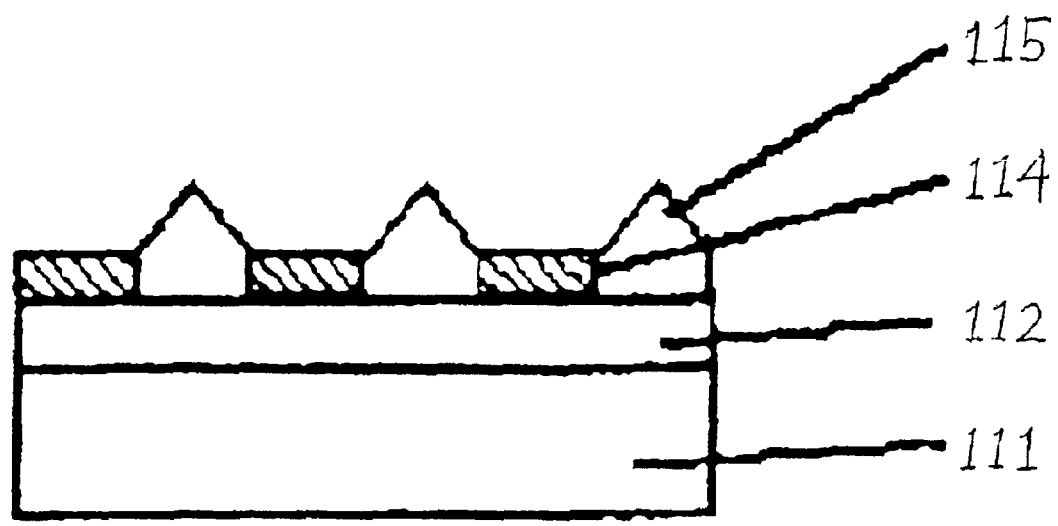
Figure 1C:
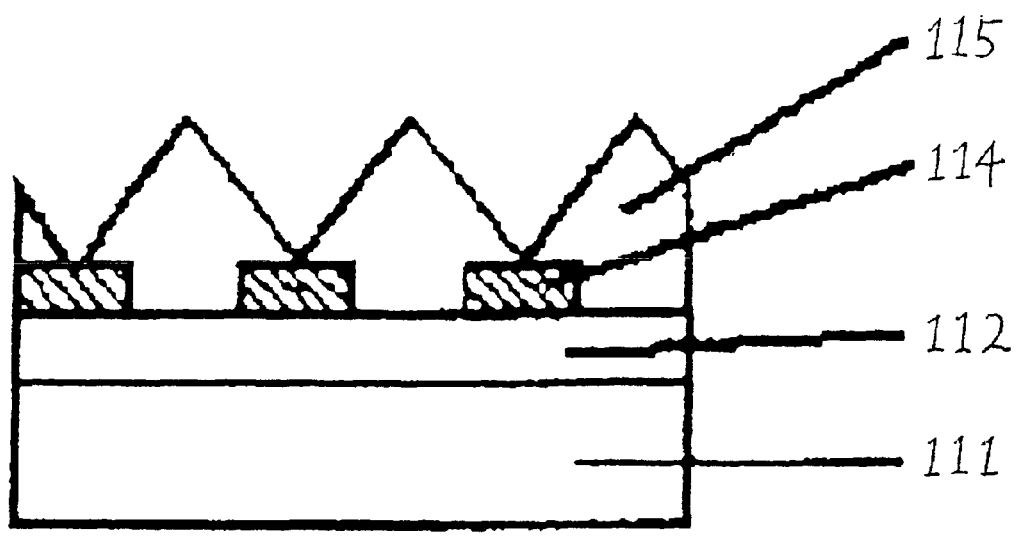
Figure 1D:
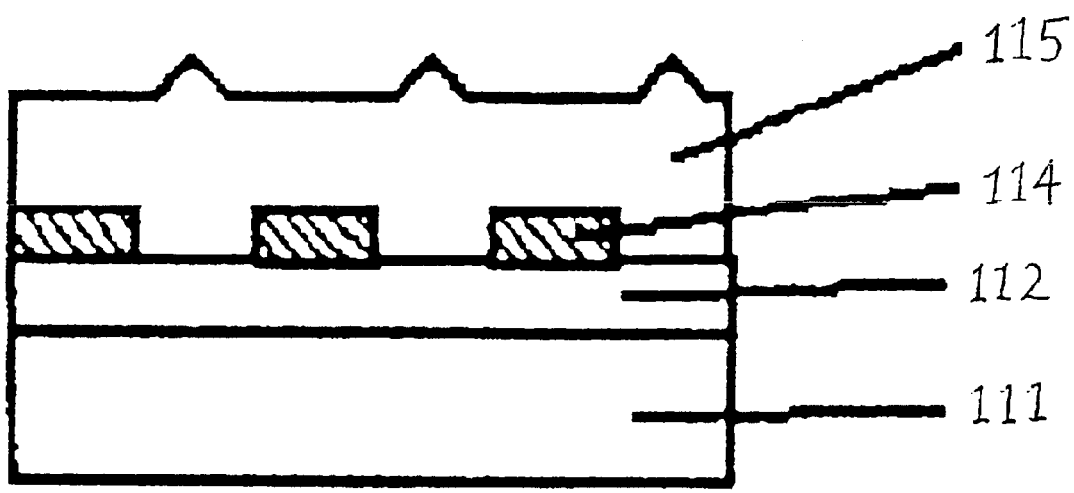
Figure 1E:
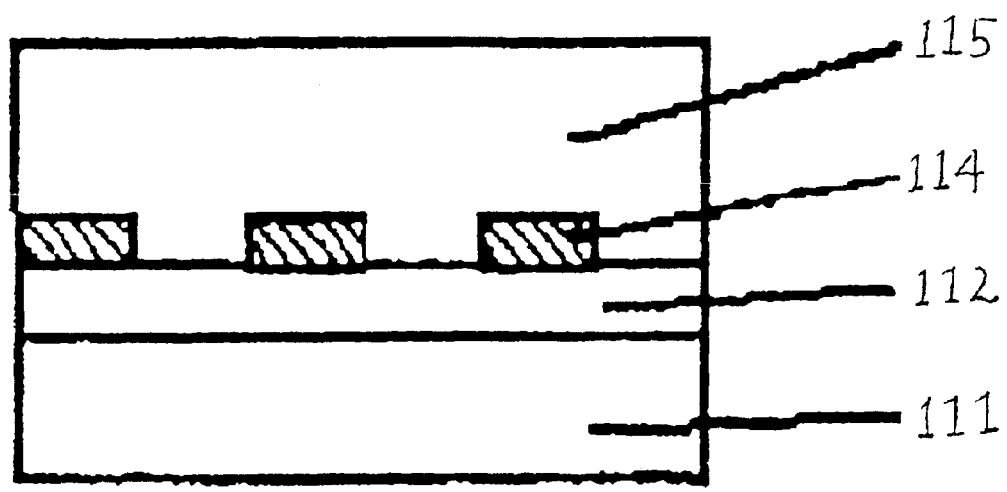

A first aspect of the present invention is a method of forming a Group III-V compound semiconductor layer. The method comprises the step of: carrying out an epitaxial growth of a Group III-V compound semiconductor layer over a base layer having a crystal structure by use of a mask, wherein the mask satisfies the equation (1):

$$h \geq (w/2)\tan\theta \quad (1)$$

where "θ" is a base angle of a facet structure of the Group III-V compound semiconductor layer on the epitaxial growth; "h" is a thickness of the mask; and "w" is an opening width of the mask at its lower level, and the opening width is defined in a direction included in a plane which is vertical to both the surface of the base layer and the side face of the facet structure.

It is preferable that the Group III-V compound semiconductor layer comprises a nitride semiconductor including a Group III element.

It is also preferable that the base layer has the same type of crystal structure as the Group III-V compound semiconductor layer.

It is also preferable that the opening of the mask has a stripe-shape with a longitudinal direction in the range of −10 degrees to +10 degrees from [1–100] of the base layer.

It is also preferable that the opening of the mask has a stripe-shape with a longitudinal direction in the range of −10 degrees to +10 degrees from [11–20] of the base layer.

It is also preferable that the Group III-V compound semiconductor layer is grown by a vapor phase epitaxy.

It is also preferable that the Group III-V compound semiconductor layer is grown until a thickness of the Group III-V compound semiconductor layer becomes thicker than the thickness "h" of the mask, so that the mask is completely buried within the Group III-V compound semiconductor layer.

It is also preferable to further comprise the steps of: forming the base layer with a substantially flat surface over a substrate; and forming the mask on the substantially flat surface, prior to the epitaxial growth.

It is further preferable that the base angle of the facet structure is defined to be an included angle between a facet face of the facet structure and the substantially flat surface of the base layer.

It is also preferable that the step of forming the mask further comprises the steps of: forming a mask material layer on the substantially flat surface of the base layer; and selectively removing the mask material layer to form the mask.

It is also preferable that the step of forming the mask further comprises the steps of: forming a first mask material layer on the substantially flat surface of the base layer; forming a second mask material layer on the first mask material layer; selectively forming a resist mask on the second mask material layer; selectively removing the second mask material layer by use of the resist mask; removing the resist mask; and selectively removing the first mask material layer by use of the second mask material layer as a mask, to form the mask which comprises a combination of the first and second mask material layers.

It is also preferable to further comprise the steps of: forming the mask over a substrate; and selectively forming the base layer over the substrate and in the opening of the mask, prior to the epitaxial growth.

It is also preferable that the base angle of the facet structure is defined to be an included angle between a facet face and a base side of the facet structure.

It is also preferable to further comprise the steps of: forming the base layer with a substantially flat surface over a substrate; forming the mask on the substantially flat surface; and selectively removing the base layer to form a base layer pattern with side walls under the mask, prior to the epitaxial growth from the side walls of the base layer pattern, so that the facet structure is formed in the opening of the mask during the epitaxial growth.

It is also preferable that the base angle of the facet structure is defined to be an included angle between a facet face and a base side of the facet structure.

It is also preferable to further comprise the step of: removing the base layer after the epitaxial growth is completed.

It is also preferable that the thickness "h" of the mask is larger than a half of the opening width "w" thereof.

A second aspect of the present invention is a Group III-V compound semiconductor epitaxial layer having an upper region which has a crystal structure with a tilt angle of at most 100 seconds.

It is also preferable that the crystal structure of the upper region has a twist angle of at most 50 seconds.

It is also preferable that the Group III-V compound semiconductor epitaxial layer comprises a nitride semiconductor including a Group III element.

A third aspect of the present invention is a Group III-V compound semiconductor epitaxial layer having an upper region which has a crystal structure with a twist angle of at most 50 seconds.

It is also preferable that the crystal structure of the upper region has a tilt angle of at most 100 seconds.

It is also preferable that the Group III-V compound semiconductor epitaxial layer comprises a nitride semiconductor including a Group III element.

A fourth aspect of the present invention is a semiconductor layered structure comprising a base layer having a crystal structure; a mask extending over the base layer, and the mask having at least one opening defined by side walls, and the at least one opening further defining at least a growth area on a surface of the base layer; and a Group III-V compound semiconductor epitaxial layer being directly on the at least growth area and the Group III-V compound semiconductor epitaxial layer completely burying the mask, wherein the Group III-V compound semiconductor epitaxial layer includes dislocations which extend substantially parallel to a thickness direction of the Group III-V compound semiconductor epitaxial layer, and at a facet face of a facet structure of the Group III-V compound semiconductor layer, the dislocations turn substantially perpendicular to the thickness direction and are terminated by the side walls of the mask.

It is also preferable that the mask satisfies the equation (1):

$$h \geq (w/2)\tan \theta \qquad (1)$$

where "θ" is a base angle of the facet structure; "h" is a thickness of the mask; and "w" is an opening width of the mask at its lower level, and the opening width is defined in a direction included in a plane which is vertical to both the surface of the base layer and a side face of the facet structure.

It is also preferable that the Group III-V compound semiconductor layer comprises a nitride semiconductor including a Group III element.

It is also preferable that the base layer has the same type of crystal structure as the Group III-V compound semiconductor layer.

It is also preferable that the opening of the mask has a stripe-shape with a longitudinal direction in the range of −10 degrees to +10 degrees from [1–100] of the base layer.

It is also preferable that the opening of the mask has a stripe-shape with a longitudinal direction in the range of −10 degrees to +10 degrees from [11–20] of the base layer.

It is also preferable that the thickness "h" of the mask is larger than a half of the opening width "w" thereof.

A fifth aspect of the present invention is a semiconductor layered structure comprising: a base layer having a crystal structure; a mask over the base layer, and the mask having at least one opening defined by side walls, and the at least one opening further defining at least a growth area of a surface of the base layer; and a Group III-V compound semiconductor epitaxial layer being directly on the at least growth area and the Group III-V compound semiconductor epitaxial layer completely burying the mask, wherein the mask satisfies the equation (1):

$$h \geq (w/2)\tan \theta \qquad (1)$$

where "θ" is a base angle of a facet structure of the Group III-V compound semiconductor layer on the epitaxial growth; "h" is a thickness of the mask; and "w" is an opening width of the mask at its lower level, and the opening width is defined in a direction included in a plane which is vertical to both the surface of the base layer and a side face of the facet structure.

It is also preferable that the Group III-V compound semiconductor epitaxial layer includes dislocations which extend substantially parallel to a thickness direction of the Group III-V compound semiconductor epitaxial layer, and at a facet face of the facet structure, the dislocations turn substantially perpendicular to the thickness direction and are terminated by the side walls of the mask.

It is also preferable that the Group III-V compound semiconductor layer comprises a nitride semiconductor including a Group III element.

It is also preferable that the base layer has the same type of crystal structure as the Group III-V compound semiconductor layer.

It is also preferable that the opening of the mask has a stripe-shape with a longitudinal direction in the range of −10 degrees to +10 degrees from [1−100] of the base layer.

It is also preferable that the opening of the mask has a stripe-shape with a longitudinal direction in the range of −10 degrees to +10 degrees from [11−20] of the base layer.

It is also preferable that the thickness "h" of the mask is larger than a half of the opening width "w" thereof.

A sixth aspect of the present invention is a substrate structure comprising: a substrate; a base layer having a crystal structure over the substrate; a mask over the base layer, and the mask having at least one opening defined by side walls, and the at least one opening further defining at least a growth area of a surface of the base layer; and a Group III-V compound semiconductor epitaxial layer being directly on the at least growth area and the Group III-V compound semiconductor epitaxial layer completely burying the mask, wherein the Group III-V compound semiconductor epitaxial layer includes dislocations which extend substantially parallel to a thickness direction of the Group III-V compound semiconductor epitaxial layer, and at a facet face of a facet structure of the Group III-V compound semiconductor epitaxial layer, the dislocations turn substantially perpendicular to the thickness direction and are terminated by the side walls of the mask.

It is also preferable that the mask satisfies the equation (1):

$$h \geq (w/2)\tan\theta \qquad (1)$$

where "θ" is a base angle of said facet structure; "h" is a thickness of the mask; and "w" is an opening width of the mask at its lower level, and the opening width is defined in a direction included in a plane which is vertical to both the surface of the base layer and a side face of the facet structure.

It is also preferable that the Group III-V compound semiconductor layer comprises a nitride semiconductor including a Group III element.

It is also preferable that the base layer has the same type of crystal structure as the Group III-V compound semiconductor layer.

It is also preferable that the opening of the mask has a stripe-shape with a longitudinal direction in the range of −10 degrees to +10 degrees from [1−100] of the base layer.

It is also preferable that the opening of the mask has a stripe-shape with a longitudinal direction in the range of −10 degrees to +10 degrees from [11−20] of the base layer.

It is also preferable that the thickness "h" of the mask is larger than a half of the opening width "w" thereof.

A seventh aspect of the present invention is a substrate structure comprising: a substrate; a base layer having a crystal structure over the substrate; a mask over the base layer, and the mask having at least one opening defined by side walls, and the at least one opening further defining at least a growth area of a surface of the base layer; and a Group III-V compound semiconductor epitaxial layer being directly on the at least growth area and the Group III-V compound semiconductor epitaxial layer completely burying the mask, wherein the mask satisfies the equation (1):

$$h \geq (w/2)\tan\theta \qquad (1)$$

where "θ" is a base angle of a facet structure of the Group III-V compound semiconductor layer on the epitaxial growth; "h" is a thickness of the mask; and "w" is an opening width of the mask at its lower level, and the opening width is defined in a direction included in a plane which is vertical to both the surface of the base layer and a side face of the facet structure.

It is also preferable that the Group III-V compound semiconductor epitaxial layer includes dislocations which extend substantially parallel to a thickness direction of the Group III-V compound semiconductor epitaxial layer, and at a facet face of the facet structure, the dislocations turn substantially perpendicular to the thickness direction and are terminated by the side walls of the mask.

It is also preferable that the Group III-V compound semiconductor layer comprises a nitride semiconductor including a Group III element.

It is also preferable that the base layer has the same type of crystal structure as the Group III-V compound semiconductor layer.

It is also preferable that the opening of the mask has a stripe-shape with a longitudinal direction in the range of −10 degrees to +10 degrees from [1−100] of the base layer.

It is also preferable that the opening of the mask has a stripe-shape with a longitudinal direction in the range of −10 degrees to +10 degrees from [11−20] of the base layer.

It is also preferable that the thickness "h" of the mask is larger than a half of the opening width "w" thereof.

An eighth aspect of the present invention is a semiconductor device including at least a Group III-V compound semiconductor epitaxial layer which includes an upper region having a crystal structure with a tilt angle of at most 100 seconds.

It is also preferable that the crystal structure of the upper region has a twist angle of at most 50 seconds.

It is also preferable that the Group III-V compound semiconductor epitaxial layer comprises a nitride semiconductor including a Group III element.

A ninth aspect of the present invention is a semiconductor device including at least a Group III-V compound semiconductor epitaxial layer which includes an upper region having a crystal structure with a twist angle of at most 50 seconds.

It is also preferable that the crystal structure of the upper region has a tilt angle of at most 100 seconds.

It is also preferable that the Group III-V compound semiconductor epitaxial layer comprises a nitride semiconductor including a Group III element.

A facet-initiated epitaxial lateral over growth has been known for a selective lateral growth of a Group III-V compound semiconductor layer by use of a mask having at least one opening, wherein a facet structure is formed in the opening of the mask during the growth process. This facet-initiated epitaxial lateral over growth is disclosed in, for example, 1999 Applied Physics 68, vol. 7 pp. 774–779. The Group III-V compound semiconductor layer may be a nitride semiconductor layer including a Group III element, which may be referred to as a Group III element nitride semiconductor.

The facet structure means a crystal structure formed by facets as crystal growing-faces in the crystal growth process. An orientation of the facet depends on an orientation of the crystal growing face of the base layer having the crystal structure, one or more growth conditions of the Group III-V compound semiconductor layer by the facet-initiated epitaxial lateral over growth, a thickness of the mask used for the facet-initiated epitaxial lateral over growth and a width of the opening of the mask.

In consideration of the orientation, the growth conditions, the mask thickness and the mask opening width, the facet structure to be obtained may be presumable. In the other words, for the purpose of obtaining a desirable or intended facet structure or facet orientation, there may appropriately be decided the orientation of the crystal growing face of the base layer, the growth conditions of the Group III-V compound semiconductor layer by the facet-initiated epitaxial lateral over growth, the mask thickness and the mask opening width.

After the mask with a predetermined thickness and having at least one opening with a predetermined width has been formed on the base layer having a crystal structure, the facet-initiated epitaxial lateral over growth of the Group III-V compound semiconductor or the Group III element nitride semiconductor is carried out with supplying source materials for the Group III-V compound semiconductor or the Group III element nitride semiconductor. The source materials may be supplied in vapor phase. The facet-initiated epitaxial lateral over growth may be realized by an available vapor phase growth method such as a hydride vapor phase epitaxy or a metal organic vapor phase epitaxy.

It has been known that the facet-initiated epitaxial lateral over growth is effective to reduce the density of dislocations of the Group III-V compound semiconductor or the Group III element nitride semiconductor as grown by the facet-initiated epitaxial lateral over growth, wherein a change in propagation direction of the dislocations in the Group III-V compound semiconductor layer or the Group III element nitride semiconductor layer may be caused at a position over the mask but not over the mask opening. This dislocation-reduction mechanism is also disclosed in 1999 Applied Physics 68, vol. 7 pp. 774–779.

The mask with at least one opening is provided to define the growth area of the base layer. In the facet-initiated epitaxial lateral over growth, the Group III-V compound semiconductor layer or the Group III element nitride semiconductor layer is grown from the growth area of the base layer defined by the mask. The mask thickness is ranged about 10 nanometers to 2 micrometers. Since the roll of the mask is only to define the growth area of the base layer, the mask thickness is the necessary minimum thickness. The opening width of the mask is thus much larger than the thickness of the mask. These are disclosed in Japanese laid-open patent publication No. 31319271.

The above described present invention is achieved by the improvement of the facet-initiated epitaxial lateral over growth by using the improved mask. The present invention utilizes a mask much thicker than the conventionally used mask for the facet-initiated epitaxial lateral over growth. For example, the mask satisfies the equation (1):

$$h \geq (w/2)\tan\theta \quad (1)$$

where "$\theta$" is a base angle of a facet structure of the Group III-V compound semiconductor layer on the epitaxial growth; "$h$" is a thickness of the mask; and "$w$" is an opening width of the mask at its lower level, and the opening width is defined in a direction included in a plane which is vertical to both the surface of the base layer and the side face of the facet structure. The facet structure having now referred has two sloped facets which are bounded with each other to form the top of the facet structure, and a base side of the facet structure is defined by the width of the opening of the mask.

If the above equation is satisfied, this means that the top of the mask is higher than the top of the facet structure, so that side walls of the mask terminate the horizontal propagation of the dislocations, wherein both a tilt angle and a twist angle of the crystal structure are well reduced in the upper region of the Group III-V compound semiconductor layer or the Group III element nitride semiconductor layer above the mask. The base layer has dislocations which propagate or extend in substantially vertical direction to the surface of the base layer. The vertical propagation of the dislocations of the base layer is terminated by the bottom of the mask, whilst a further vertical propagation of the dislocations of the base layer may be allowed through the opening of the mask.

The dislocations vertically extending in the base layer are further propagated in substantially vertical direction through the opening of the mask into the Group III-V compound semiconductor layer or the Group III element nitride semiconductor layer over the base layer in the facet-initiated epitaxial lateral over growth by use of the mask. As described above, the Group III-V compound semiconductor layer or the Group III element nitride semiconductor layer is grown from the growth area defined by the mask opening. During the epitaxial growth from the growth area, the facet structure is once formed. The facet structure has a base side defined by the opening width of the mask or by the growth area. The facet structure has two sloped facet faces which are bounded with each other to form a top of the facet structure.

In the Group III-V compound semiconductor layer or the Group III element nitride semiconductor layer, the dislocations further propagate in the substantially vertical direction from the growth area of the base layer through the opening of the mask. When these dislocations reach at the facet faces of the facet structure, the propagating direction of the dislocations is changed from the substantially vertical direction to a substantially horizontal direction which is substantially parallel to the surface of the base layer. Since, however, the top of the mask is higher than the top of the facet structure, then the substantially horizontal propagation of the dislocations is blocked or terminated by the side walls of the mask, thereby causing substantially no further propagation of the dislocations into the upper region, over the mask, of the Group III-V compound semiconductor layer or the Group III element nitride semiconductor layer. As a result, the tilt angle and the twist angle of the crystal structure of the upper region, over the mask, of the Group III-V compound semiconductor layer or the Group III element nitride semiconductor layer are well reduced by not only the bottom of the mask but also the side walls of the mask.

In the prior art, the dislocations are terminated by only the bottom of the mask and the further propagating dislocations through the opening of the mask are allowed up to the upper region or the top surface of the Group III-V compound semiconductor layer or the Group III element nitride semiconductor layer. For this reason, it is desirable to further reduce the tilt angle and the twist angle of the crystal structure of the upper region of the Group III-V compound semiconductor layer or the Group III element nitride semiconductor layer.

In accordance with the present invention, however, the dislocations propagating in the base layer are terminated by the bottom of the mask, whilst the dislocations further propagating through the opening of the mask and in the Group III-V compound semiconductor layer or the Group III element nitride semiconductor layer are terminated by the side walls of the mask, thereby causing no further propagation of the dislocations up to the upper region or the top surface of the Group III-V compound semiconductor layer or the Group III element nitride semiconductor layer. For this reason, the tilt angle and the twist angle of the crystal structure of the upper region of the Group III-V compound semiconductor layer or the Group III element nitride semiconductor layer is greatly reduced.

In accordance with the present invention, the tilt angle and the twist angle are the important indexes for the degree of the perfection of the crystal structure, even in the prior art, the dislocation only is the important index for the degree of the perfection of the crystal structure. In the prior art, the evaluation on the degree of the crystal perfection of the Group III-V compound semiconductor layer or the Group III element nitride semiconductor layer had depended on the dislocation density. By contrast, in accordance with the present invention, the evaluation on the degree of the crystal perfection of the Group III-V compound semiconductor layer or the Group III element nitride semiconductor layer would depend on the tilt angle and/or the twist angle. The conventional techniques have been developed for reducing the dislocation density in the crystal of the compound semiconductor epitaxial layer, but those conventional techniques are not to improve the mosaic crystal structure which is caused by the tilt and twist of the crystal axis.

The present inventors could find out that the mosaic crystal structure influences electrical and optical properties of the crystal. The present inventors could realize the mosaic-reduced crystal structure of the Group III-V compound semiconductor layer or the Group III element nitride semiconductor layer, particularly in the upper region or the upper surface. Namely the present inventors could also realize desirable substantial reduction in the tilt angle and the twist angle of the crystal axis of the crystal structure of the upper region or the upper surface of the Group III-V compound semiconductor layer or the Group III element nitride semiconductor layer grown by the facet-initiated epitaxial lateral over growth by using the improved mask which satisfies the above described specific structural conditions represented by the above-described equation (1).

The desirable mosaic-reduced crystal structure of the upper region or the upper surface of the Group III-V compound semiconductor layer or the Group III element nitride semiconductor layer is preferable for a semiconductor device which is provided on the upper region or the upper surface. If the semiconductor device is a semiconductor light emitting device such as a semiconductor laser device, then it may be expectable that remarkable reductions in internal loss and driving current of the semiconductor laser device may be obtained, whereby a remarkable increase in life-time of the semiconductor laser device can be obtained.

The above descriptions of the difference of the present invention from the prior art will hereinafter be more embodied by way of illustrations of the mechanism of the propagation of the dislocations.

Figure 2:
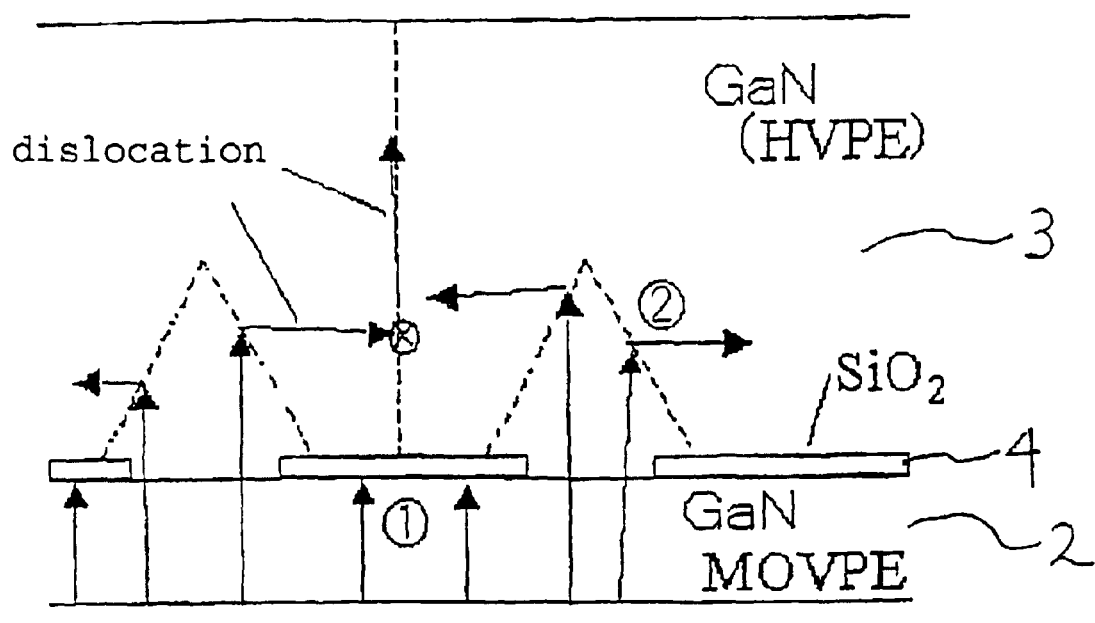
FIG. 2 is a schematic view illustrative of the mechanism of propagation of the dislocations in the GaN epitaxial layer during the hydride vapor phase epitaxy as one of the facet-initiated epitaxial lateral over growth by using the conventional mask.

FIG. 2 is a schematic view illustrative of the mechanism of propagation of the dislocations in the GaN epitaxial layer during the hydride vapor phase epitaxy as one of the facet-initiated epitaxial lateral over growth by using the conventional mask. Arrow marks represent the orbits of the propagation of the dislocation. Broken lines represent facet faces of the facet structure.

A GaN epitaxial base layer 2 is grown on a sapphire substrate 1 by a metal organic vapor phase epitaxy. A conventional mask 4 of $SiO_2$ with openings is provided on the GaN epitaxial base layer. A GaN epitaxial layer 3 is grown over the GaN epitaxial base layer and the conventional mask 4 by a hydride vapor phase epitaxy as one of the facet-initiated epitaxial lateral over growth. The GaN epitaxial base layer 2 has dislocations which vertically propagate in a direction parallel to a thickness direction of the GaN epitaxial base layer.

As shown by (1), the propagation of the dislocations in the GaN epitaxial base layer 2 are blocked or terminated by the bottom of the conventional mask 4. The opening of the conventional mask 4 allows further vertical propagation of the dislocations from the base layer.

Namely, the dislocations vertically extending in the GaN epitaxial base layer 2 are further propagated in substantially vertical direction through the opening of the conventional mask 4 into the GaN epitaxial layer 3 over the GaN epitaxial base layer 2. As described above, the GaN epitaxial layer 3 is grown from the growth areas defined by the openings of the conventional mask 4. During the epitaxial growth from the growth areas, the facet structure is once formed. The facet structure has a base side defined by the opening width of the mask or by the growth area. The facet structure has two sloped facet faces which are bounded with each other to form a top of the facet structure.

In the GaN epitaxial layer 3, the dislocations further propagate in the substantially vertical direction from the growth areas of the GaN epitaxial base layer 2 through the openings of the conventional mask 4. When these dislocations reach at the facet faces of the facet structure, the propagating direction of the dislocations is changed from the substantially vertical direction to substantially horizontal directions which are substantially parallel to the surface of the GaN epitaxial base layer 2.

Since, however, the top of the conventional mask 4 is much lower than the top of the facet structure, then the substantially horizontal propagation of the dislocations is further changed to directions perpendicular to the horizontal directions of the substantially horizontal propagation of the dislocations. Namely, some of the dislocations are further propagated in the direction parallel to the thickness direction and toward the upper surface of the GaN epitaxial layer 3. The upper surface or the upper region of the GaN epitaxial layer 3 has a dislocation density which is lower than the dislocation density of the GaN epitaxial base layer 2. For this reason, the upper surface or the upper region of the GaN epitaxial layer 3 has the undesirable mosaic-like crystal structure. Therefore, it is desirable to block the propagation of almost all of the dislocations.

In accordance with the present invention, the tilt angle and the twist angle are the important indexes for the degree of the perfection of the crystal structure or for the evaluation of how many mosaic crystal structure was improved. The tilt angle of the crystal axis is defined by an angle of tilting of the crystal axis from the C-axis. The tilt angle may be calculated from a measured half-width of a locking curve of an X-ray reflected by a (0002)-face of the crystal structure. The twist angle may be measured by a glancing incidence diffraction method (GID-method) utilizing an X-ray reflection by a (10—10)-face of the crystal structure. This GID-method is disclosed in 1999 Japanese Journal of Applied Physics vol. 38, p. 611.

The present inventors measured the tilt angle and the twist angle of the conventional GaN layer 115 grown by the facet-initiated epitaxial lateral over growth and the tilt angle and the twist angle of the GaN base layer 112 over the sapphire substrate 111 shown in FIGS. 1A through 1E. The conventional GaN layer 115 has a thickness of 140 micrometers. Of the conventional GaN layer 115, the measured tilt angle was 180 seconds and the measured twist angle was 208 seconds. Of the GaN base layer 112, the measured tilt angle was 324 seconds and the measured twist angle was 1188 seconds. The conventional GaN layer 115 grown by the facet-initiated epitaxial lateral over growth using the conventional mask 114 is smaller in the tilt angle and the twist angle than the GaN base layer 112. The conventional GaN layer 115 is, however, larger in the tilt angle and the twist angle than the GaAs substrate and the InP substrate. The present inventors attempted to increase the thickness of the conventional GaN layer 115 up to 550 micrometers which was also grown by the facet-initiated epitaxial lateral over growth using the conventional mask 114. The measured tilt angle was 90 seconds whilst the measured twist angle was 184 seconds. The increase in the thickness of the conventional GaN layer 115 grown by the facet-initiated epitaxial lateral over growth using the conventional mask 114 reduces but only the tilt angle.

The present inventors further attempted to carrying out two times of the facet-initiated epitaxial lateral over growth using the conventional masks. The first time facet-initiated epitaxial lateral over growth was carried out using the first conventional mask, whereby a first GaN epitaxial layer having a thickness of 40 micrometers was grown over the GaN base layer. A second conventional mask of $SiO_2$ was provided on the first GaN epitaxial layer. The second time facet-initiated epitaxial lateral over growth was carried out using the second conventional mask, whereby a second GaN epitaxial layer having a thickness of 70 micrometers was grown over the first GaN epitaxial layer. The measured tilt angle of the second GaN epitaxial layer was 133 seconds. The measured twist angle of the second GaN epitaxial layer was also 133 seconds. The tilt angle and the twist angle are lower than those of the conventional one. It is, however, desirable to further reduce the tilt angle and the twist angle.

In the above-described circumstances, the present inventors improved the mask structure and reached the present invention.

Figure 3A:
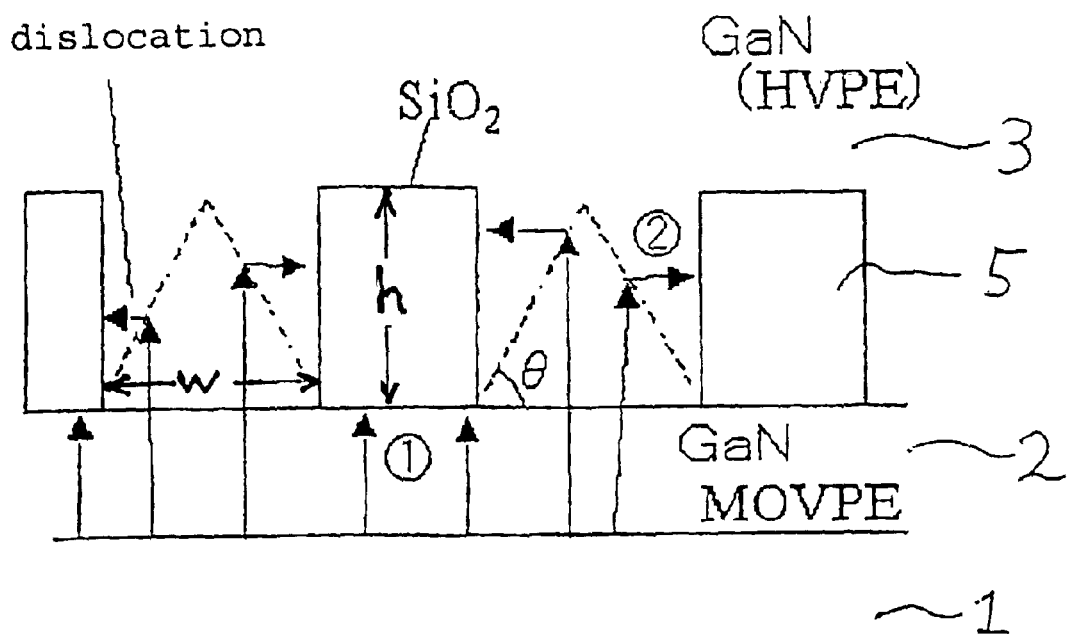
FIG. 3A is a schematic view illustrative of the mechanism of propagation of the dislocations in the GaN epitaxial layer during the hydride vapor phase epitaxy as one of the facet-initiated epitaxial lateral over growth by using the improved mask in accordance with the first embodiment of the present invention.

FIG. 3A is a schematic view illustrative of the mechanism of propagation of the dislocations in the GaN epitaxial layer during the hydride vapor phase epitaxy as one of the facet-initiated epitaxial lateral over growth by using the improved mask in accordance with the first embodiment of the present invention. Arrow marks represent the orbits of the propagation of the dislocation. Broken lines represent facet faces of the facet structure.

A GaN epitaxial base layer 2 is grown on a sapphire substrate 1 by a metal organic vapor phase epitaxy. An improved mask 5 of $SiO_2$ with openings is provided on the GaN epitaxial base layer 2. A GaN epitaxial layer 3 is grown over the GaN epitaxial base layer and the improved mask 5 by the hydride vapor phase epitaxy as one of the facet-initiated epitaxial lateral over growth. The GaN epitaxial base layer 2 has dislocations which vertically propagate in a direction parallel to a thickness direction of the GaN epitaxial base layer.

As shown by (1), the propagation of the dislocations in the GaN epitaxial base layer 2 are blocked or terminated by the bottom of the improved mask 5. The opening of the improved mask 5 allows further vertical propagation of the dislocations from the base layer.

Namely, the dislocations vertically extending in the GaN epitaxial base layer 2 are further propagated in substantially vertical direction through the opening of the improved mask 5 into the GaN epitaxial layer 3 over the GaN epitaxial base layer 2. As described above, the GaN epitaxial layer 3 is grown from the growth areas defined by the openings of the improved mask 5. During the epitaxial growth from the growth areas, the facet structure is once formed. The facet structure has a base side defined by the opening width of the mask or by the growth area. The facet structure has two sloped facet faces which are bounded with each other to form a top of the facet structure.

In the GaN epitaxial layer 3, the dislocations further propagate in the substantially vertical direction from the growth areas of the GaN epitaxial base layer 2 through the openings of the improved mask 5. When these dislocations reach at the facet faces of the facet structure, the propagating direction of the dislocations is changed from the substantially vertical direction to substantially horizontal directions which are substantially parallel to the surface of the GaN epitaxial base layer 2.

The improved mask 5 satisfies the equation (1):

$$h \geq (w/2)\tan\theta \qquad (1)$$

where "θ" is a base angle of a facet structure of the Group III-V compound semiconductor layer on the epitaxial growth; "h" is a thickness of the mask; and "w" is an opening width of the mask at its lower level, and the opening width is defined in a direction included in a plane which is vertical to both the surface of the base layer and the side face of the facet structure. Namely, the opening width of the mask is defined in the direction parallel to both a normal vector of the surface of the base layer and another normal vector of the side face of the facet structure. The opening width of the mask is decided depending on the thickness of the mask and the facet angle "θ". The opening width of the mask may preferably be at least 3 micrometers. The top of the improved mask 5 is higher than the top of the facet structure, then the horizontally propagating dislocations as turned at the facet faces of the facet structure are blocked or terminated by the side walls of the improved mask 5 as shown by (2), thereby causing substantially no further propagation of the dislocations into the upper region, over the improved mask 5, of the GaN epitaxial base layer 2. As a result, the tilt angle and the twist angle of the crystal structure of the upper region, over the mask, of the GaN epitaxial base layer 2 are well reduced by not only the bottom of the improved mask 5 but also the side walls of the improved mask 5.

In the above first embodiment, GaN is selected as one example of the Group III element nitride semiconductor layer. $In_xAl_yGa_{1-x-y}N$ ($X \geq 0$, $Y \geq 0$, $X+Y \leq 0$) may be selected as the Group III element nitride semiconductor layer. GaN, AlGaN or InAlGaN is available.

The shape of the opening of the mask may be optional. A stripe-shape, a rectangle-shape, a circular-shape and an oval shape may be available as the shape of the opening of the mask. The stripe-shape is preferable as the shape of the opening of the mask for easy formation of the facet structure. The longitudinal direction of the stripe-shaped opening of the mask may preferably be in the range of −10 degrees to +10 degrees from [11–20] of the Group III element nitride semiconductor layer. In this case, the facet structure has a (1–101)-side face. Also, the longitudinal direction of the stripe-shaped opening of the mask may preferably be in the range of −10 degrees to +10 degrees from [1–100] of the Group III element nitride semiconductor layer. In this case, the facet structure has a (11–22)-side face.

Even in the first embodiment, GaN is selected as one example of the available crystal materials of the base layer.

Any other crystal materials for allowing the crystal growth thereon are available. The base layer may comprise a substrate having a crystal structure, for example, a sapphire substrate, a Si substrate, a SiC substrate, a langaside ($La_3Ga_5SiO_{14}$) substrate, an Al substrate, or a GaAs substrate. The base layer may also comprise a Group III element nitride semiconductor layer over one of those substrates, wherein the Group III element nitride semiconductor layer may be made of GaN, AlN, or AlGaN. The base layer may also comprise a Group III element nitride semiconductor substrate which may be made of GaN, AlN, or AlGaN.

Figure 3B:
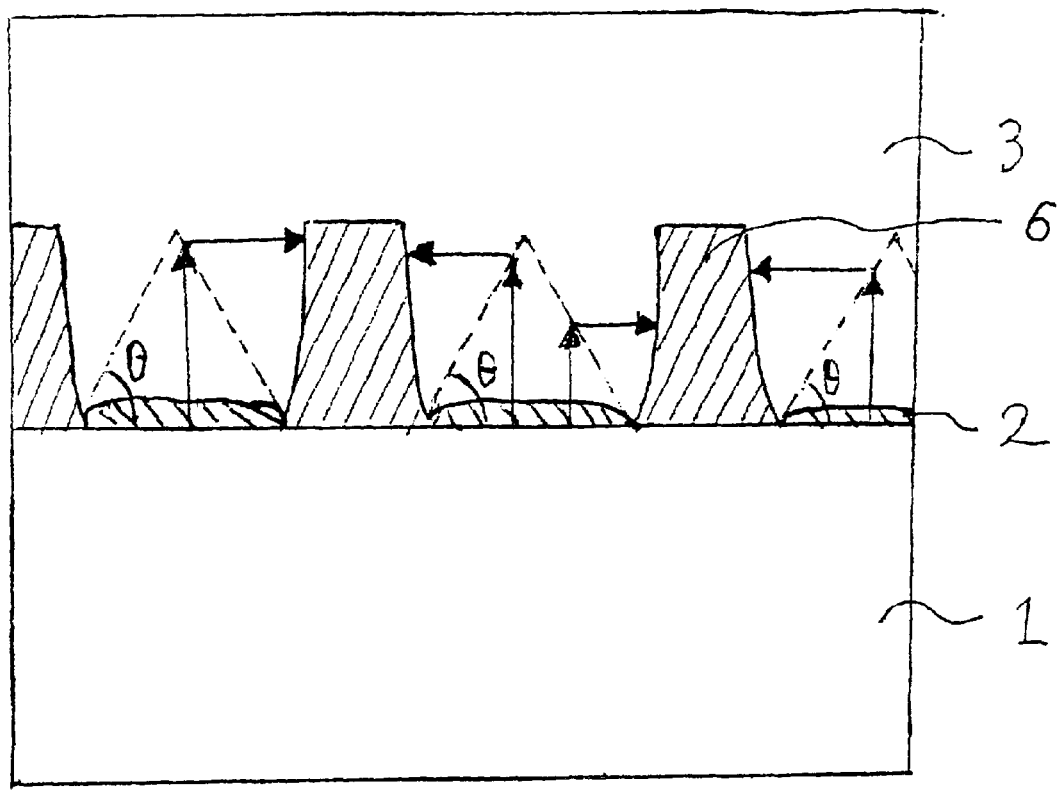
FIG. 3B is a schematic view illustrative of the mechanism of propagation of the dislocations in the GaN epitaxial layer during the hydride vapor phase epitaxy as one of the facet-initiated epitaxial lateral over growth by using the improved mask in accordance with the second embodiment of the present invention.

FIG. 3B is a schematic view illustrative of the mechanism of propagation of the dislocations in the GaN epitaxial layer during the hydride vapor phase epitaxy as one of the facet-initiated epitaxial lateral over growth by using the improved mask in accordance with the second embodiment of the present invention. Arrow marks represent the orbits of the propagation of the dislocation. Broken lines represent facet faces of the facet structure.

An improved mask 6 of $SiO_2$ with openings is provided on a sapphire substrate 1. A GaN epitaxial base layer 2 is selectively formed on the sapphire substrate 1 and in the openings of the improved mask 6. A GaN epitaxial layer 3 is grown over the GaN epitaxial base layer and the improved mask 6 by the hydride vapor phase epitaxy as one of the facet-initiated epitaxial lateral over growth. The GaN epitaxial base layer 2 has dislocations which vertically propagate in a direction parallel to a thickness direction of the GaN epitaxial base layer.

The dislocations in the GaN epitaxial base layer 2 are propagated into the GaN epitaxial layer 3. Namely, the dislocations vertically extending in the GaN epitaxial base layer 2 further propagate in substantially vertical direction into the GaN epitaxial layer 3. During the epitaxial growth from the growth areas, the facet structure is once formed. The facet structure has a base side defined by the opening width of the mask or by the growth area. The facet structure has two sloped facet faces which are bounded with each other to form a top of the facet structure.

In the GaN epitaxial layer 3, the dislocations further propagate in the substantially vertical direction from the GaN epitaxial base layer 2. When these dislocations reach at the facet faces of the facet structure, the propagating direction of the dislocations is changed from the substantially vertical direction to substantially horizontal directions which are substantially parallel to the surface of the sapphire substrate 1.

The improved mask 6 satisfies the equation (1):

$$h \geq (w/2)\tan\theta \quad (1)$$

where "θ" is a base angle of the facet structure; "h" is a thickness of the improved mask 6; and "w" is an opening width of the improved mask 6 at its lower level, and the opening width is defined in a direction included in a plane which is vertical to both the surface of the sapphire substrate 1 and the side face of the facet structure. Namely, the opening width of the improved mask 6 is defined in the direction parallel to both a normal vector of the surface of the sapphire substrate 1 and another normal vector of the side face of the facet structure. The opening width of the improved mask 6 is decided depending on the thickness of the improved mask 6 and the facet angle "θ". The opening width of the improved mask 6 may preferably be at least 3 micrometers. The top of the improved mask 6 is higher than the top of the facet structure, then the horizontally propagating dislocations as turned at the facet faces of the facet structure are blocked or terminated by the side walls of the improved mask 6, thereby causing substantially no further propagation of the dislocations into the upper region, over the improved mask 6, of the GaN epitaxial layer 3. As a result, the tilt angle and the twist angle of the crystal structure of the upper region, over the mask, of the GaN epitaxial layer 3 are well reduced by the side walls of the improved mask 6.

Figure 3C:
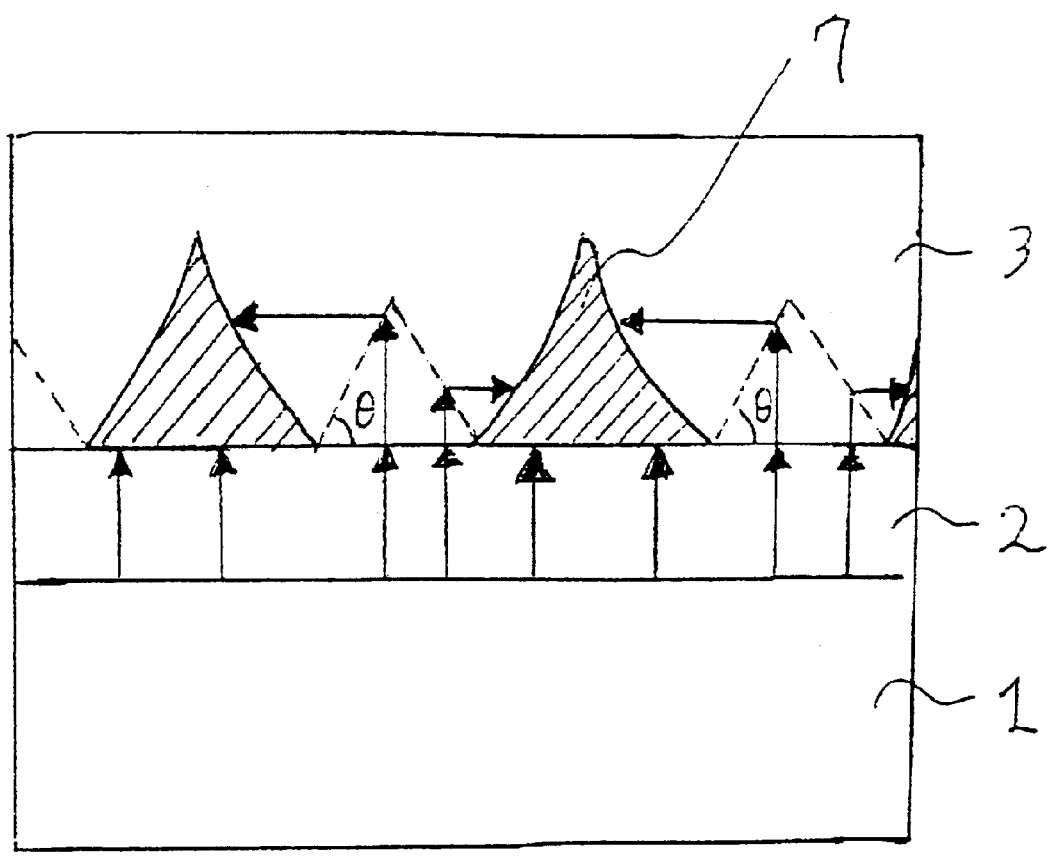
FIG. 3C is a schematic view illustrative of the mechanism of propagation of the dislocations in the GaN epitaxial layer during the hydride vapor phase epitaxy as one of the facet-initiated epitaxial lateral over growth by using the improved mask in accordance with the third embodiment of the present invention.

FIG. 3C is a schematic view illustrative of the mechanism of propagation of the dislocations in the GaN epitaxial layer during the hydride vapor phase epitaxy as one of the facet-initiated epitaxial lateral over growth by using the improved mask in accordance with the third embodiment of the present invention. Arrow marks represent the orbits of the propagation of the dislocation. Broken lines represent facet faces of the facet structure.

A GaN epitaxial base layer 2 is grown on a sapphire substrate 1 by a metal organic vapor phase epitaxy. An improved mask 7 of $SiO_2$ with openings is provided on the GaN epitaxial base layer 2. A GaN epitaxial layer 3 is grown over the GaN epitaxial base layer and the improved mask 7 by the hydride vapor phase epitaxy as one of the facet-initiated epitaxial lateral over growth. The GaN epitaxial base layer 2 has dislocations which vertically propagate in a direction parallel to a thickness direction of the GaN epitaxial base layer.

The propagation of the dislocations in the GaN epitaxial base layer 2 are blocked or terminated by the bottom of the improved mask 7. The opening of the improved mask 7 allows further vertical propagation of the dislocations from the base layer 2.

Namely, the dislocations vertically extending in the GaN epitaxial base layer 2 are further propagated in substantially vertical direction through the opening of the improved mask 7 into the GaN epitaxial layer 3 over the GaN epitaxial base layer 2. As described above, the GaN epitaxial layer 3 is grown from the growth areas defined by the openings of the improved mask 7. During the epitaxial growth from the growth areas, the facet structure is once formed. The facet structure has a base side defined by the opening width of the mask or by the growth area. The facet structure has two sloped facet faces which are bounded with each other to form a top of the facet structure.

In the GaN epitaxial layer 3, the dislocations further propagate in the substantially vertical direction from the growth areas of the GaN epitaxial base layer 2 through the openings of the improved mask 7. When these dislocations reach at the facet faces of the facet structure, the propagating direction of the dislocations is changed from the substantially vertical direction to substantially horizontal directions which are substantially parallel to the surface of the GaN epitaxial base layer 2.

The improved mask 7 satisfies the equation (1):

$$h \geq (w/2)\tan\theta \quad (1)$$

where "θ" is a base angle of the facet structure; "h" is a thickness of the mask; and "w" is an opening width of the improved mask 7 at its lower level, and the opening width is defined in a direction included in a plane which is vertical to both the surface of the base layer 2 and the side face of the facet structure. Namely, the opening width of the improved mask 7 is defined in the direction parallel to both a normal vector of the surface of the base layer 2 and another normal vector of the side face of the facet structure. The opening width of the improved mask 7 is decided depending on the thickness of the mask and the facet angle "θ". The opening width of the mask may preferably be at least 3 micrometers. The top of the improved mask 7 is higher than the top of the facet structure, then the horizontally propagating dislocations as turned at the facet faces of the facet structure are blocked or terminated by the side walls of the improved mask 7, thereby causing substantially no further propagation of the dislocations into the upper region, over the improved mask 7, of the GaN epitaxial layer 3. As a result, the tilt angle and the twist angle of the crystal structure of the upper region, over the mask, of the GaN epitaxial layer 3 are well reduced by not only the bottom of the improved mask 7 but also the side walls of the improved mask 7.

Figure 3D:
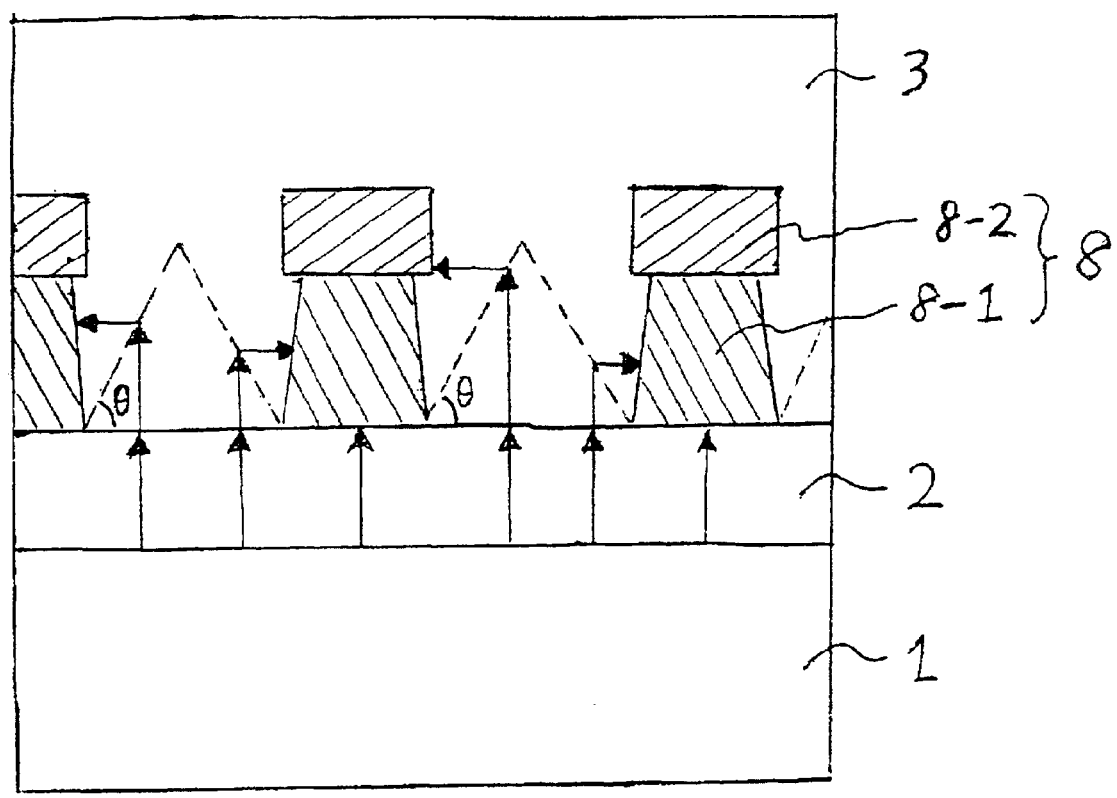
FIG. 3D is a schematic view illustrative of the mechanism of propagation of the dislocations in the GaN epitaxial layer during the hydride vapor phase epitaxy as one of the facet-initiated epitaxial lateral over growth by using the improved mask in accordance with the fourth embodiment of the present invention.

FIG. 3D is a schematic view illustrative of the mechanism of propagation of the dislocations in the GaN epitaxial layer during the hydride vapor phase epitaxy as one of the facet-initiated epitaxial lateral over growth by using the improved mask in accordance with the fourth embodiment of the present invention. Arrow marks represent the orbits of the propagation of the dislocation. Broken lines represent facet faces of the facet structure.

A GaN epitaxial base layer 2 is grown on a sapphire substrate 1 by a metal organic vapor phase epitaxy. An improved mask 8 with openings is provided on the GaN epitaxial base layer 2. The improved mask 8 comprises a double layered structure. For example, the improved mask 8 comprises laminations of a lower mask layer 8-1 of $SiO_2$ and an upper mask layer 8-2 of SiN. A GaN epitaxial layer 3 is grown over the GaN epitaxial base layer and the improved mask 8 by the hydride vapor phase epitaxy as one of the facet-initiated epitaxial lateral over growth. The GaN epitaxial base layer 2 has dislocations which vertically propagate in a direction parallel to a thickness direction of the GaN epitaxial base layer.

The propagation of the dislocations in the GaN epitaxial base layer 2 are blocked or terminated by the bottom of the improved mask 8. The opening of the improved mask 8 allows further vertical propagation of the dislocations from the base layer 2.

Namely, the dislocations vertically extending in the GaN epitaxial base layer 2 are further propagated in substantially vertical direction through the opening of the improved mask 8 into the GaN epitaxial layer 3 over the GaN epitaxial base layer 2. As described above, the GaN epitaxial layer 3 is grown from the growth areas defined by the openings of the improved mask 8. During the epitaxial growth from the growth areas, the facet structure is once formed. The facet structure has a base side defined by the opening width of the mask or by the growth area. The facet structure has two sloped facet faces which are bounded with each other to form a top of the facet structure.

In the GaN epitaxial layer 3, the dislocations further propagate in the substantially vertical direction from the growth areas of the GaN epitaxial base layer 2 through the openings of the improved mask 8. When these dislocations reach at the facet faces of the facet structure, the propagating direction of the dislocations is changed from the substantially vertical direction to substantially horizontal directions which are substantially parallel to the surface of the GaN epitaxial base layer 2.

The improved mask 8 satisfies the equation (1):

$$h \geq (w/2)\tan\theta \tag{1}$$

where "θ" is a base angle of the facet structure; "h" is a thickness of the improved mask 8; and "w" is an opening width of the improved mask 8 at its lower level, and the opening width is defined in a direction included in a plane which is vertical to both the surface of the base layer 2 and the side face of the facet structure. Namely, the opening width of the improved mask 8 is defined in the direction parallel to both a normal vector of the surface of the base layer and another normal vector of the side face of the facet structure. The opening width of the improved mask 8 is decided depending on the thickness of the improved mask 8 and the facet angle "θ". The opening width of the improved mask 8 may preferably be at least 3 micrometers. The top of the improved mask 8 is higher than the top of the facet structure, then the horizontally propagating dislocations as turned at the facet faces of the facet structure are blocked or terminated by the side walls of the improved mask 8, thereby causing substantially no further propagation of the dislocations into the upper region, over the improved mask 8, of the GaN epitaxial layer 3. As a result, the tilt angle and the twist angle of the crystal structure of the upper region, over the mask, of the GaN epitaxial layer 3 are well reduced by not only the bottom of the improved mask 8 but also the side walls of the improved mask 8.

Figure 3E:
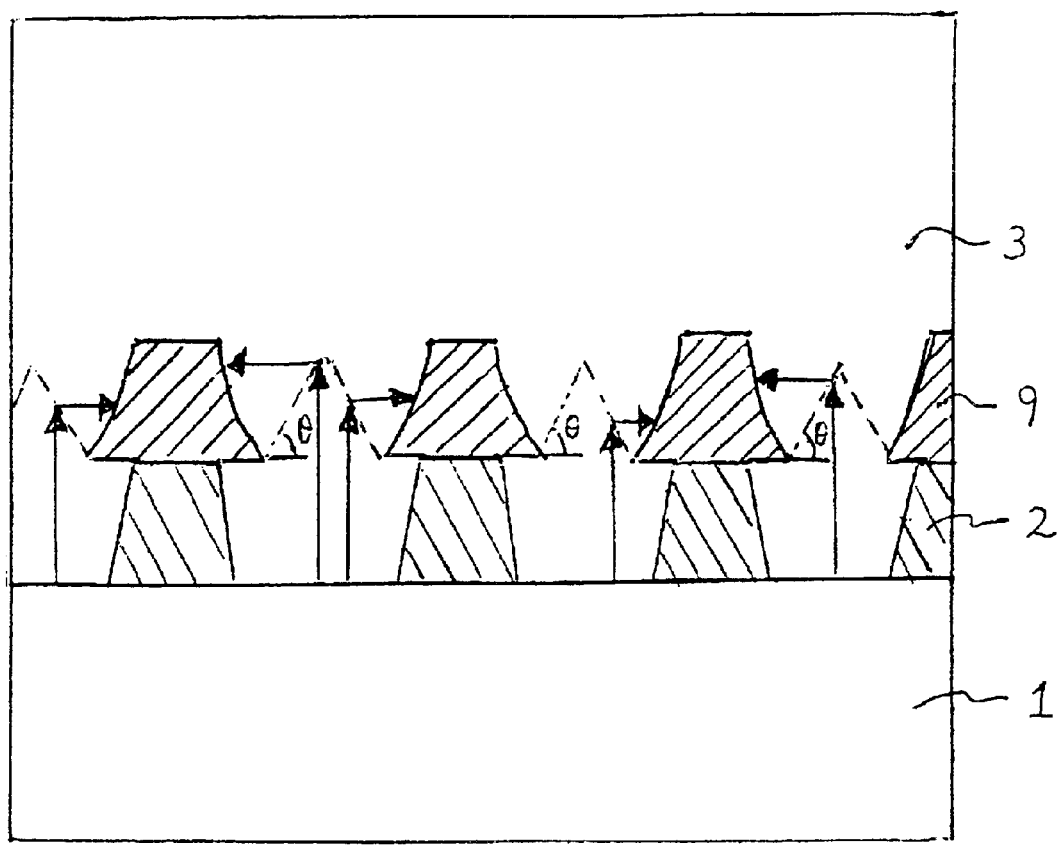
FIG. 3E is a schematic view illustrative of the mechanism of propagation of the dislocations in the GaN epitaxial layer during the hydride vapor phase epitaxy as one of the facet-initiated epitaxial lateral over growth by using the improved mask in accordance with the fifth embodiment of the present invention.

FIG. 3E is a schematic view illustrative of the mechanism of propagation of the dislocations in the GaN epitaxial layer during the hydride vapor phase epitaxy as one of the facet-initiated epitaxial lateral over growth by using the improved mask in accordance with the fifth embodiment of the present invention. Arrow marks represent the orbits of the propagation of the dislocation. Broken lines represent facet faces of the facet structure.

A GaN epitaxial base layer 2 is grown on a sapphire substrate 1 by a metal organic vapor phase epitaxy. An improved mask 9 of $SiO_2$ with openings is provided on the GaN epitaxial base layer 2. The GaN epitaxial base layer 2 is selectively removed by use of the improved mask 9, so that the GaN epitaxial base layer 2 remains only under the improved mask 9, and the surface of the sapphire substrate 1 is partially exposed. Side walls of the remaining GaN epitaxial base layer 2 are also the growth areas. A GaN epitaxial layer 3 is grown from the side walls of the remaining GaN epitaxial base layer 2 and from the sapphire substrate 1 by the hydride vapor phase epitaxy as one of the facet-initiated epitaxial lateral over growth, so that the GaN epitaxial layer 3 is grown over the GaN epitaxial base layer and the improved mask 9. The lower region of the GaN epitaxial layer 3 has dislocations which vertically propagate in a direction parallel to a thickness direction of the GaN epitaxial base layer.

The propagation of the dislocations in the lower region of the GaN epitaxial layer 3 below the improved mask 9 are further propagated in substantially vertical direction through the opening of the improved mask 9 into the upper region of the GaN epitaxial layer 3 over the lower region thereof. During the epitaxial growth over the lower region of the GaN epitaxial layer 3, the facet structure is once formed. The facet structure has a base side defined by the opening width of the mask or by the growth area. The facet structure has two sloped facet faces which are bounded with each other to form a top of the facet structure.

In the upper region of the GaN epitaxial layer 3, the dislocations further propagate in the substantially vertical direction from the lower region thereof through the openings of the improved mask 9. When these dislocations reach at the facet faces of the facet structure, the propagating direction of the dislocations is changed from the substantially vertical direction to substantially horizontal directions which are substantially parallel to the surface of the sapphire substrate 1.

The improved mask 9 satisfies the equation (1):

$$h \geq (w/2)\tan\theta \tag{1}$$

where "θ" is a base angle of the facet structure; "h" is a thickness of the mask; and "w" is an opening width of the improved mask 9 at its lower level, and the opening width is defined in a direction included in a plane which is vertical to both the surface of the sapphire substrate 1 and the side face of the facet structure. Namely, the opening width of the improved mask 9 is defined in the direction parallel to both a normal vector of the surface of the sapphire substrate 1 and another normal vector of the side face of the facet structure. The opening width of the improved mask 9 is decided depending on the thickness of the mask and the facet angle "θ". The opening width of the mask may preferably be at least 3 micrometers. The top of the improved mask 9 is higher than the top of the facet structure, then the horizontally propagating dislocations as turned at the facet faces of the facet structure are blocked or terminated by the side walls of the improved mask 9, thereby causing substantially no further propagation of the dislocations into the upper region, over the improved mask 9, of the GaN epitaxial layer 3. As a result, the tilt angle and the twist angle of the crystal structure of the upper region, over the mask, of the GaN epitaxial layer 3 are well reduced by not only the bottom of the improved mask 9 but also the side walls of the improved mask 9.

Figure 3F:
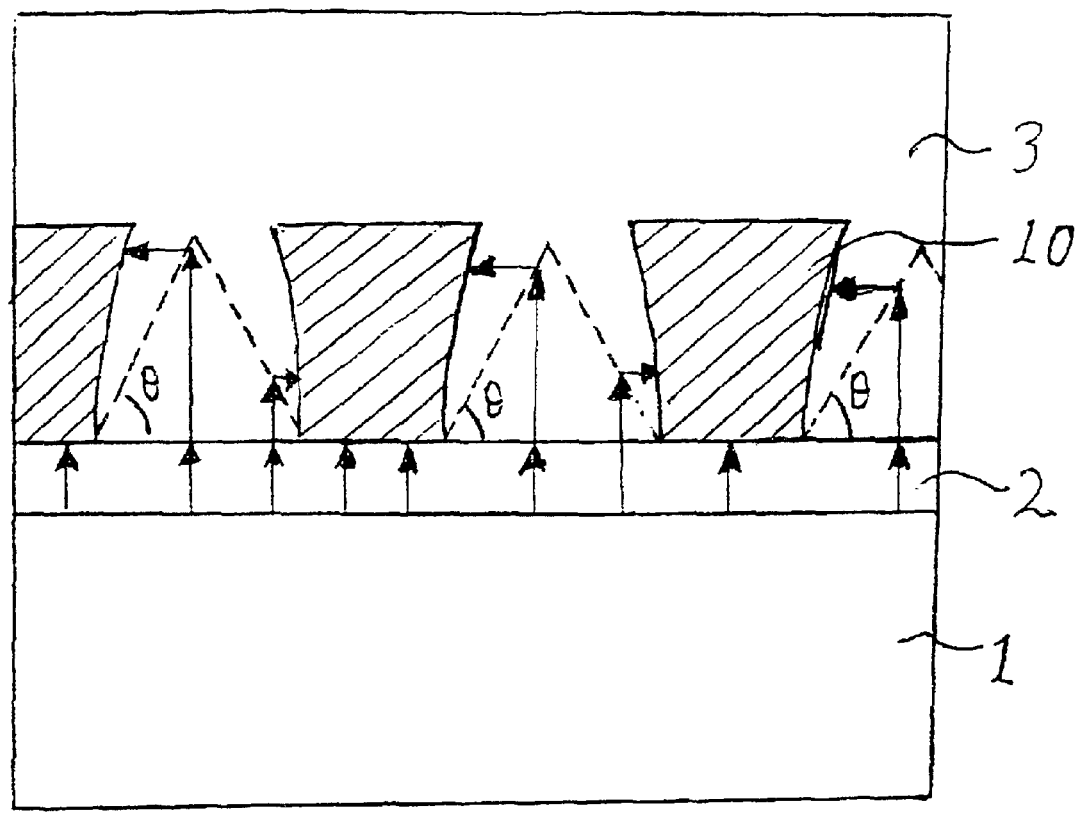
FIG. 3F is a schematic view illustrative of the mechanism of propagation of the dislocations in the GaN epitaxial layer during the hydride vapor phase epitaxy as one of the facet-initiated epitaxial lateral over growth by using the improved mask in accordance with the sixth embodiment of the present invention.

FIG. 3F is a schematic view illustrative of the mechanism of propagation of the dislocations in the GaN epitaxial layer during the hydride vapor phase epitaxy as one of the facet-initiated epitaxial lateral over growth by using the improved mask in accordance with the sixth embodiment of the present invention. Arrow marks represent the orbits of the propagation of the dislocation. Broken lines represent facet faces of the facet structure.

A GaN epitaxial base layer 2 is grown on a sapphire substrate 1 by a metal organic vapor phase epitaxy. An improved mask 10 of $SiO_2$ with openings is provided on the GaN epitaxial base layer 2. A GaN epitaxial layer 3 is grown over the GaN epitaxial base layer and the improved mask 10 by the hydride vapor phase epitaxy as one of the facet-initiated epitaxial lateral over growth. The GaN epitaxial base layer 2 has dislocations which vertically propagate in a direction parallel to a thickness direction of the GaN epitaxial base layer.

The propagation of the dislocations in the GaN epitaxial base layer 2 are blocked or terminated by the bottom of the improved mask 10. The opening of the improved mask 10 allows further vertical propagation of the dislocations from the base layer 2.

Namely, the dislocations vertically extending in the GaN epitaxial base layer 2 are further propagated in substantially vertical direction through the opening of the improved mask 10 into the GaN epitaxial layer 3 over the GaN epitaxial base layer 2. As described above, the GaN epitaxial layer 3 is grown from the growth areas defined by the openings of the improved mask 10. During the epitaxial growth from the growth areas, the facet structure is once formed. The facet structure has a base side defined by the opening width of the mask or by the growth area. The facet structure has two sloped facet faces which are bounded with each other to form a top of the facet structure.

In the GaN epitaxial layer 3, the dislocations further propagate in the substantially vertical direction from the growth areas of the GaN epitaxial base layer 2 through the openings of the improved mask 10. When these dislocations reach at the facet faces of the facet structure, the propagating direction of the dislocations is changed from the substantially vertical direction to substantially horizontal directions which are substantially parallel to the surface of the GaN epitaxial base layer 2.

The improved mask 10 satisfies the equation (1):

$$h \geq (w/2)\tan \theta \qquad (1)$$

where "θ" is a base angle of the facet structure; "h" is a thickness of the mask; and "w" is an opening width of the improved mask 10 at its lower level, and the opening width is defined in a direction included in a plane which is vertical to both the surface of the base layer 2 and the side face of the facet structure. Namely, the opening width of the improved mask 10 is defined in the direction parallel to both a normal vector of the surface of the base layer 2 and another normal vector of the side face of the facet structure. The opening width of the improved mask 10 is decided depending on the thickness of the mask and the facet angle "θ". The opening width of the mask may preferably be at least 3 micrometers. The top of the improved mask 10 is higher than the top of the facet structure, then the horizontally propagating dislocations as turned at the facet faces of the facet structure are blocked or terminated by the side walls of the improved mask 10, thereby causing substantially no further propagation of the dislocations into the upper region, over the improved mask 10, of the GaN epitaxial layer 3. As a result, the tilt angle and the twist angle of the crystal structure of the upper region, over the mask, of the GaN epitaxial layer 3 are well reduced by not only the bottom of the improved mask 10 but also the side walls of the improved mask 10.

First Embodiment:

The subject matter of the first embodiment of the present invention has been described with reference to FIG. 3A, particularly focusing on the mechanisms of how the dislocations are blocked or terminated by the improved mask. The first embodiment according to the present invention will be described again in more detail with reference to the drawings. FIGS. 4A through 4E are fragmentary cross sectional elevation views of the semiconductor substrates in sequential steps involved in a novel formation method in the first embodiment in accordance with the present invention.

Figure 4A:
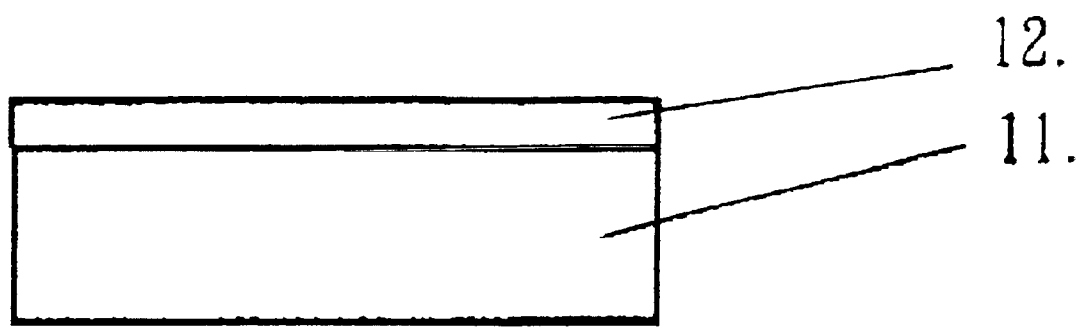
FIGS. 4A through 4E are fragmentary cross sectional elevation views of the semiconductor substrates in sequential steps involved in a novel formation method in the first embodiment in accordance with the present invention.

With reference to FIG. 4A, a sapphire substrate 11 with a (0001)-face was prepared. The (0001)-face of the sapphire substrate 11 was cleaned. A GaN base layer 12 having a thickness of 1.5 micrometers was grown on the (0001)-face of the sapphire substrate 11 by a metal organic vapor phase epitaxy. This metal organic vapor phase epitaxy was carried out as follows. The sapphire substrate 11 was heated up to a temperature of 1050° C. in an atmosphere comprising a hydrogen gas and a nitrogen gas, so that a heat treatment was carried out for about 10 minutes. After the heat treatment, then the temperature of the sapphire substrate 11 was decreased to 500° C., so that trimethyl gallium (TMG) was supplied at a flow rate of 10 micro-mol/minute and an ammonium gas ($NH_3$) was supplied at a flow rate of 4000 cc/minute, whereby a GaN layer having a thickness of 30 nanometers was formed on the (0001)-face of the sapphire substrate 11. During supplying an ammonium gas, a hydrogen gas and a nitrogen gas, the temperature of the sapphire substrate 11 was increased up to a temperature of 1050° C. After the temperature of 1050 C of the sapphire substrate 11 became stable, trimethyl gallium (TMG) was supplied at a flow rate of 40 micro-mol/minute, whereby the GaN base layer 12 having the thickness of 1.5 micrometers was grown.

Figure 4B:
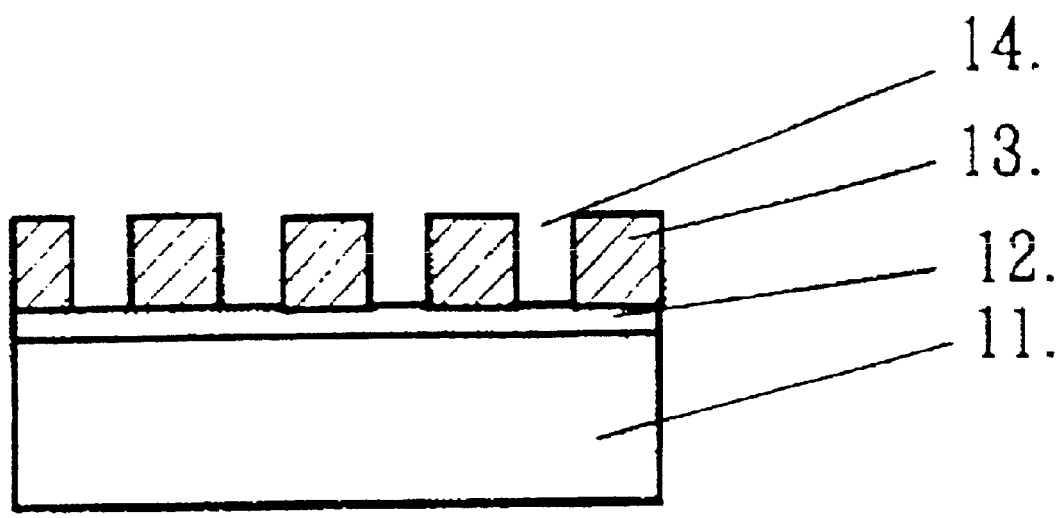

With reference to FIG. 4B, a thermal chemical vapor deposition was carried out by use of silane ($SiH_4$) and oxygen ($O_2$) to deposit a $SiO_2$ film 13 having a thickness of 4 micrometers on the GaN base layer 12. The thermal chemical vapor deposition was carried out under the following conditions. The temperature was 430° C. Nitrogen ($N_2$) was used as a carrier gas. A partial pressure of silane ($SiH_4$) was 4E-4 atm. A partial pressure of oxygen ($O_2$) was 4E-3 atm. A resist film was applied on the $SiO_2$ film 13. An exposure and a subsequent development of the resist film were carried out to form a resist pattern having stripe-shaped openings. A reactive ion etching process was carried out by use of $CF_4$ gas or $Cl_2$ gas for selectively etching the $SiO_2$ film 13, whereby stripe-shaped openings 14 were formed in the $SiO_2$ film 13. As a result, the $SiO_2$ mask 13 with the stripe-shaped openings 14 was prepared, wherein the stripe-shaped openings 14 are defined by vertical side walls of the $SiO_2$ mask 13. A longitudinal direction of the stripe-shaped openings 14 is [11–20] of the GaN base layer 12. The stripe-shaped openings 14 have a width of 2 micrometers. The stripe-shaped openings 14 are aligned at a constant pitch of 7 micrometers.

Figure 4C:
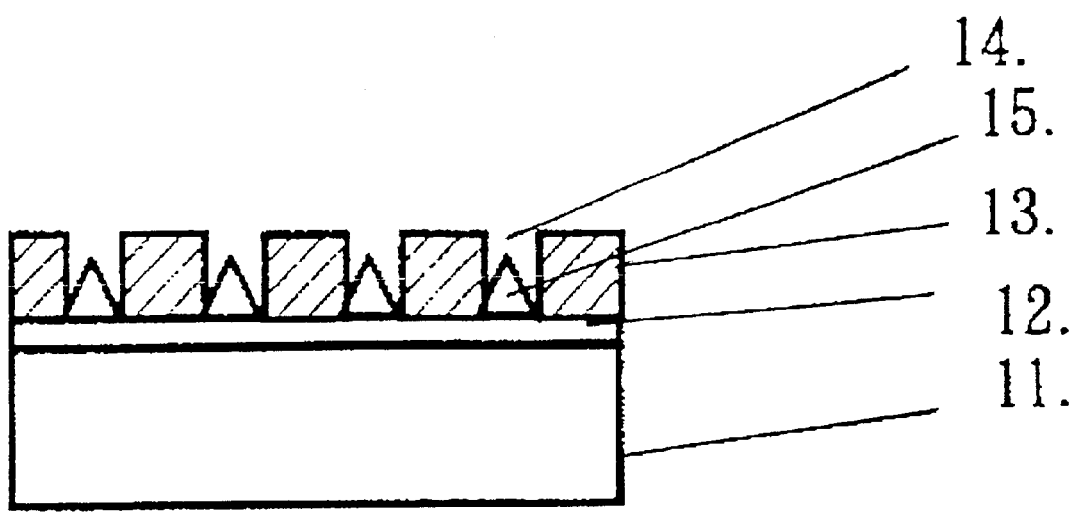
Figure 4D:
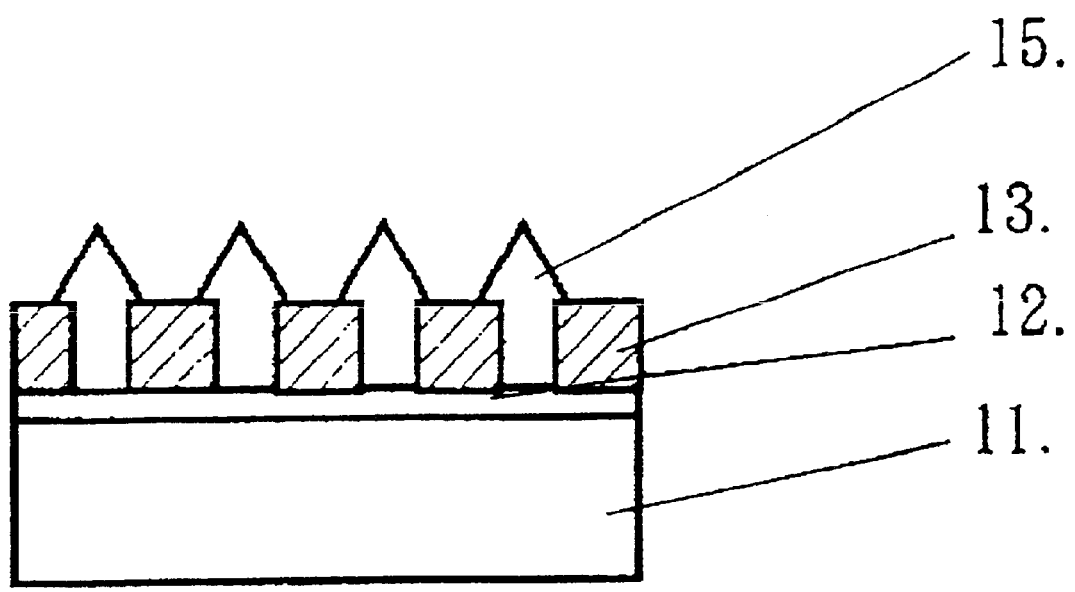
Figure 4E:
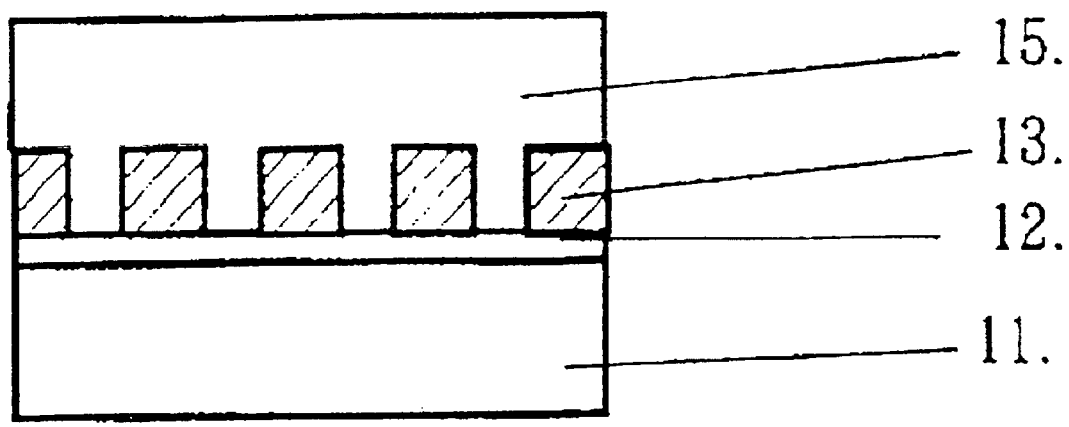

With reference to FIGS. 4C, 4D and 4E, a GaN layer 15 was grown over the GaN base layer 12 by a hydride vapor phase epitaxy (HVPE) using the $SiO_2$ mask 13 with the stripe-shaped openings 14 by supplying gallium chloride (GaCl) and $NH_3$. The hydride vapor phase epitaxy (HVPE) is one of the facet-initiated epitaxial lateral over growth. The hydride vapor phase epitaxy (HVPE) was carried out as follows. The sapphire substrate 11 was placed in a growth chamber of a hydride vapor phase epitaxy system. During when a hydrogen gas and an ammonium gas are supplied, and also a temperature was increased up to 1020° C., wherein the supply of the ammonium gas was started when the temperature reaches 600° C.

After the temperature of the growth area has become stable, then the supply of GaCl was started to grow the GaN film 15, wherein a partial pressure of HCl was 5.3E-3 atm, whilst another partial pressure of $NH_3$ was 0.26 atm. In the initial growth process, the GaN layer 15 is epitaxially grown from the growth areas of the GaN base layer 12 defined by the openings 14 of the mask 13. Facet structures were formed over the growth areas and in the openings 14 of the mask 13, wherein the facet structures have (1–102)-side faces as shown in FIG. 4C. The epitaxial growth was continued, wherein the GaN layer 15 with the facet structures over the mask 13 was grown as shown in FIG. 4D. The epitaxial growth was still continued, and the facet structures became large in size and adjacent two of the facet structures became united. The epitaxial growth was still continued, and the GaN layer 15 became having a flat surface as shown in FIG. 4E. The epitaxial growth for 5 hours formed the GaN epitaxial layer 15 having a thickness of 200 micrometers.

After the epitaxial growth of the GaN epitaxial layer 15 was completed, then the temperature was decreased by supplying $NH_3$ gas and hydrogen gas. When the temperature dropped to about 600° C., the supply of the $NH_3$ gas was discontinued. The temperature was then further dropped to the ordinary temperature, so that the used gases in the growth chamber were replaced by the nitrogen gas prior to having picked up the substrate.

The GaN epitaxial layer 15 was then observed by an interference microscope. It was confirmed that the GaN epitaxial layer 15 has a highly flat surface. It was also confirmed that the GaN epitaxial layer 15 exhibits an n-type conductivity, and a carrier concentration of 1E16 $cm^{-3}$ at the ordinary temperature. It was also confirmed that the GaN epitaxial layer 15 has a Hall-mobility of 800 $cm^2/Vs$. An etch-pit density of the surface of the GaN epitaxial layer 15 was measured using a phosphate-based solution. The measured etch-pit density was not more than 5E6 $cm^{-2}$. A twist angle and a tilt angle of the crystal axis of the surface of the GaN epitaxial layer 15 were measured by the above described X-ray diffraction method. It was confirmed that the twist angle is 50 seconds and the tilt angle was 100 seconds.

Second Embodiment:

The subject matter of the second embodiment of the present invention has been described with reference to FIG. 3B, particularly focusing on the mechanisms of how the dislocations are blocked or terminated by the improved mask. The second embodiment according to the present invention will be described again in more detail with reference to the drawings. FIGS. 5A through 5D are fragmentary cross sectional elevation views of the semiconductor substrates in sequential steps involved in a novel formation method in the second embodiment in accordance with the present invention.

Figure 5A:
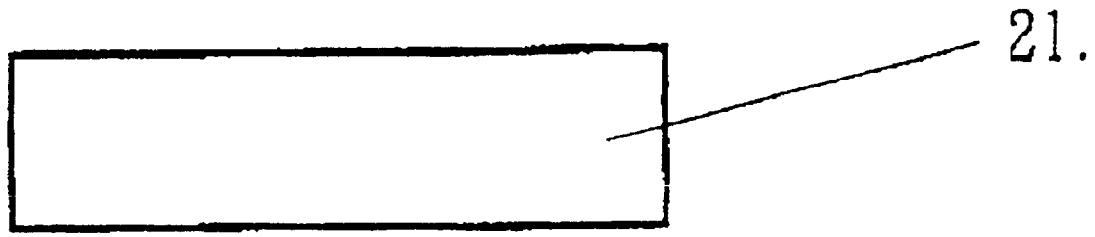
FIGS. 5A through 5D are fragmentary cross sectional elevation views of the semiconductor substrates in sequential steps involved in a novel formation method in the second embodiment in accordance with the present invention.

With reference to FIG. 5A, a sapphire substrate 21 with a (0001)-face was prepared. The (0001)-face of the sapphire substrate 21 was cleaned.

Figure 5B:
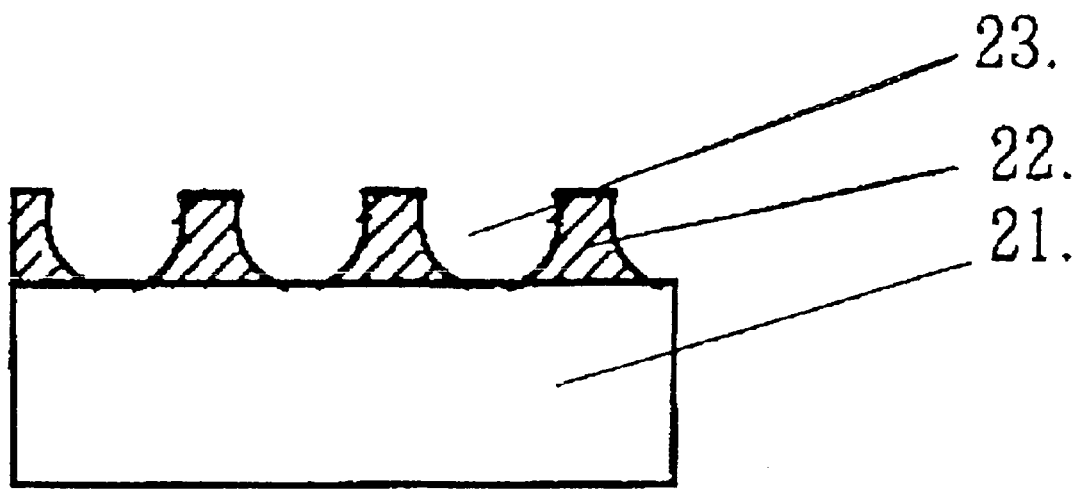

With reference to FIG. 5B, a thermal chemical vapor deposition was carried out by use of silane ($SiH_4$) and oxygen ($O_2$) to deposit a $SiO_2$ film 22 having a thickness of 4 micrometers on the (0001)-face of the sapphire substrate 21. The thermal chemical vapor deposition was carried out under the following conditions. The temperature was 430° C. Nitrogen ($N_2$) was used as a carrier gas. A partial pressure of silane ($SiH_4$) was 4E-4 atm. A partial pressure of oxygen ($O_2$) was 4E-3 atm. A resist film was applied on the $SiO_2$ film 22. An exposure and a subsequent development of the resist film were carried out to form a resist pattern having stripe-shaped openings. A wet etching process was carried out for selectively etching the $SiO_2$ film 22, whereby stripe-shaped openings 23 were formed in the $SiO_2$ film 22. As a result, the $SiO_2$ mask 22 with the stripe-shaped openings 23 was prepared, wherein the stripe-shaped openings 23 are defined by sloped side walls of the $SiO_2$ mask 22. A longitudinal direction of the stripe-shaped openings 23 is [1–100] of the sapphire substrate 21. The stripe-shaped openings 23 have a width of 2 micrometers at the bottom level of the $SiO_2$ mask 22. The stripe-shaped openings 23 are aligned at a constant pitch of 12 micrometers. The above wet etching was carried out by use of a buffered fluorine acid solution for about 14 minutes.

Figure 5C:
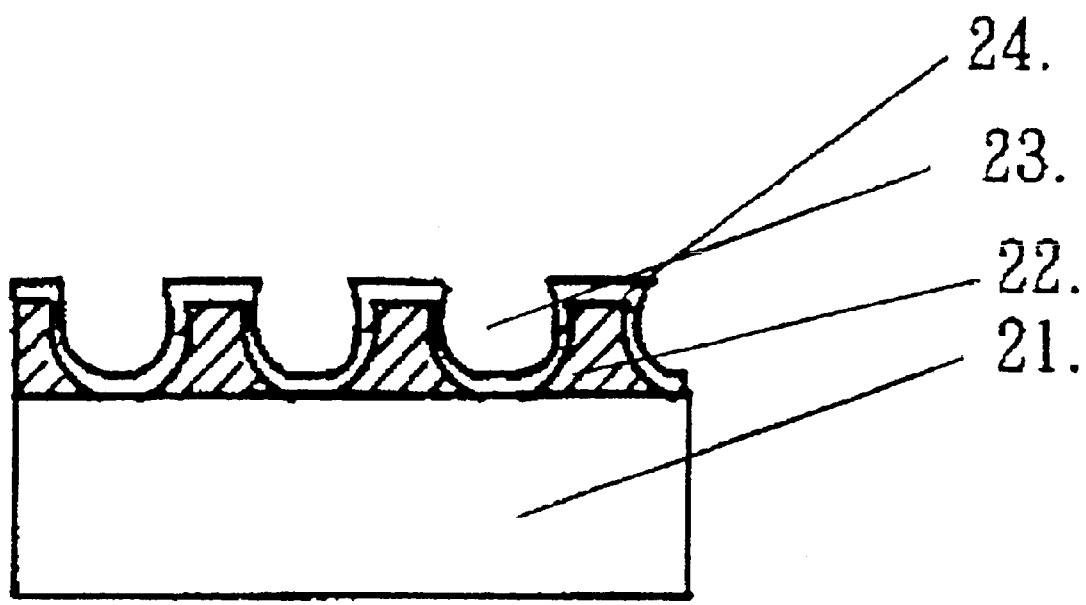

With reference to FIG. 5C, an amorphous GaN layer 24 having a thickness of 60 nanometers was grown on the (0001)-face of the sapphire substrate 21 defined in the openings 23 of the $SiO_2$ mask 22 and also over the $SiO_2$ mask 22 by a metal organic vapor phase epitaxy. This metal organic vapor phase epitaxy was carried out as follows. The sapphire substrate 21 was heated up to a temperature of 1070° C. in an atmosphere comprising a hydrogen gas, so that a heat treatment was carried out for about 10 minutes. After the heat treatment, then the temperature of the sapphire substrate 21 was decreased to 500° C., so that trimethyl gallium (TMG) was supplied at a flow rate of 10 micromol/minute and an ammonium gas ($NH_3$) was supplied at a flow rate of 4000 cc/minute, whereby the amorphous GaN layer 24 having the thickness of 60 nanometers was formed on the (0001)-face of the sapphire substrate 21 defined in the openings 23 of the mask 22 and also over the mask 22. After the growth of the amorphous GaN layer 24 was completed, then the temperature was dropped to the ordinary temperature. The substrate 21 was taken out from the growth chamber.

Figure 5D:
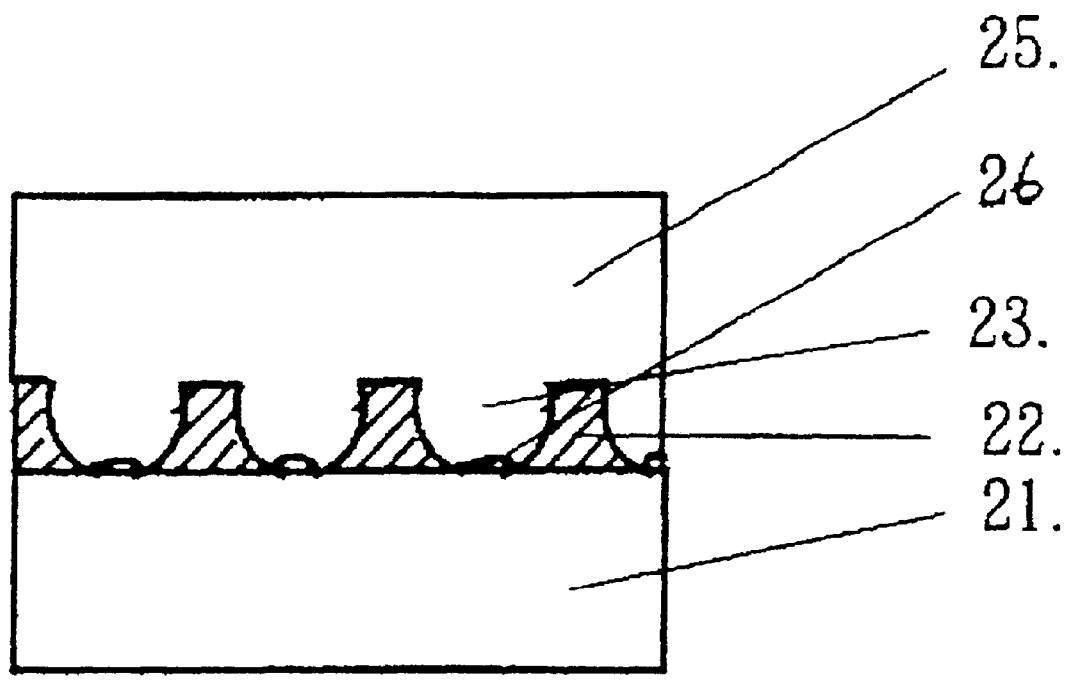

With reference to FIG. 5D, a GaN layer 25 was grown over the mask 22 and the substrate 21 by a hydride vapor phase epitaxy (HVPE) using the $SiO_2$ mask 22 with the stripe-shaped openings 23. The hydride vapor phase epitaxy (HVPE) is one of the facet-initiated epitaxial lateral over growth. The hydride vapor phase epitaxy (HVPE) was carried out as follows. The sapphire substrate 21 was placed in a growth chamber of a hydride vapor phase epitaxy system. During when a hydrogen gas was supplied, for taking 40 minutes, the temperature was increased up to 10200° C., wherein the supply of the ammonium gas under a partial pressure of $NH_3$ at 0.15 atm was started when the temperature reaches about 600° C. This temperature increasing process, the majority part of the above amorphous GaN layer 24 was evaporated, while the remaining part thereof became the single crystal GaN base layers 26.

After the temperature of the growth area has become stable, then the supply of GaCl was started to grow the GaN film 25, wherein the supply of GaCl was made under a partial pressure of HCl was 2E-3 atm for 30 minutes, and then the partial pressure of HCl was increased up to 1E-2 atm, whereby the GaN film 25 was grown. In the initial growth process, the GaN layer 25 is epitaxially grown from the remaining single crystal GaN base layers 26 as the growth areas in the openings 23 of the mask 22. Facet structures were formed over the growth areas and in the openings 23 of the mask 22. The epitaxial growth was continued, wherein the GaN layer 25 with the facet structures over the mask 22 was grown. The epitaxial growth was still continued, and the facet structures became large in size and adjacent two of the facet structures became united. The epitaxial growth was still continued, and the GaN layer 25 became having a flat surface. The epitaxial growth for 6 hours formed the GaN epitaxial layer 25 having a thickness of 450 micrometers.

After the epitaxial growth of the GaN epitaxial layer 25 was completed, then the temperature was decreased by supplying $NH_3$ gas and hydrogen gas. When the temperature dropped to about 600° C., the supply of the $NH_3$ gas was discontinued. The temperature was then further dropped to the ordinary temperature, so that the used gases in the growth chamber were replaced by the nitrogen gas prior to having picked up the substrate.

The substrate 21 was removed by a polishing method, whereby a single layered structure of the GaN epitaxial layer 25 was obtained.

The GaN epitaxial layer 25 was then observed by an interference microscope. It was confirmed that the GaN epitaxial layer 25 has a highly flat surface. It was also confirmed that the GaN epitaxial layer 25 exhibits an n-type conductivity, and a carrier concentration of $8E17$ cm$^{-3}$ at the ordinary temperature. It was also confirmed that the GaN epitaxial layer 25 has a Hall-mobility of 300 cm$^2$/Vs. After a passivation film was formed on the bottom surface of the GaN epitaxial layer 25, then an etch-pit density of the surface of the GaN epitaxial layer 25 was measured using a phosphate-based solution. The measured etch-pit density was not more than $5E6$ cm$^{-2}$. An X-ray diffraction by a (0002)-face of the surface of the GaN epitaxial layer 25 was carried out. It was confirmed that a half width of the X-ray diffraction is 100 seconds which means that the tilt angle is 100 seconds.

Third Embodiment:

The subject matter of the third embodiment of the present invention has been described with reference to FIG. 3C, particularly focusing on the mechanisms of how the dislocations are blocked or terminated by the improved mask. The third embodiment according to the present invention will be described again in more detail with reference to the drawings. FIGS. 6A through 6F are fragmentary cross sectional elevation views of the semiconductor substrates in sequential steps involved in a novel formation method in the third embodiment in accordance with the present invention.

Figure 6A:
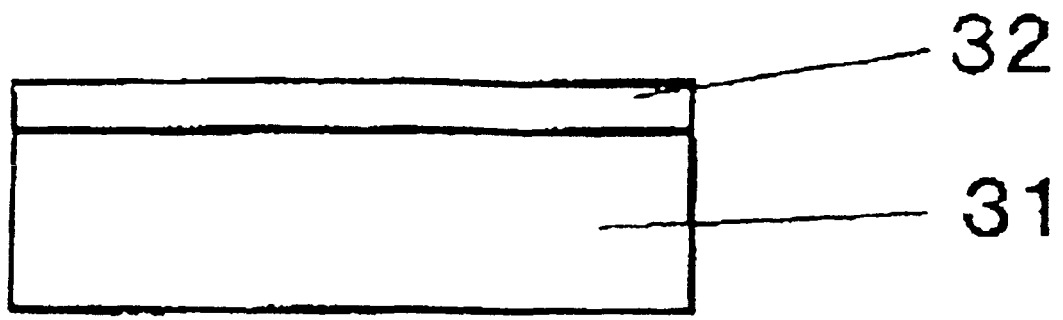
FIGS. 6A through 6F are fragmentary cross sectional elevation views of the semiconductor substrates in sequential steps involved in a novel formation method in the third embodiment in accordance with the present invention.

With reference to FIG. 6A, a silicon substrate 31 with a (111)-face was prepared. The (111)-face of the silicon substrate 31 was cleaned. An AlN base layer 32 having a thickness of 0.4 micrometers was grown on the (111)-face of the silicon substrate 31 by a metal organic vapor phase epitaxy. This metal organic vapor phase epitaxy was carried out as follows. The silicon substrate 31 was heated up to a temperature of 1050° C. in an atmosphere comprising a hydrogen gas and a nitrogen gas, so that a heat treatment was carried out for about 10 minutes. After the heat treatment, then the temperature of the silicon substrate 31 was decreased to 500° C., so that trimethyl aluminum (TMA) was supplied at a flow rate of 50 micro-mol/minute and an ammonium gas ($NH_3$) was supplied at a flow rate of 5000 cc/minute, whereby an AlN layer having a thickness of 0.4 micrometers was formed on the (111)-face of the silicon substrate 31. During supplying an ammonium gas, a hydrogen gas and a nitrogen gas, the temperature of the silicon substrate 31 was decreased to a temperature of 500° C.

Figure 6B:
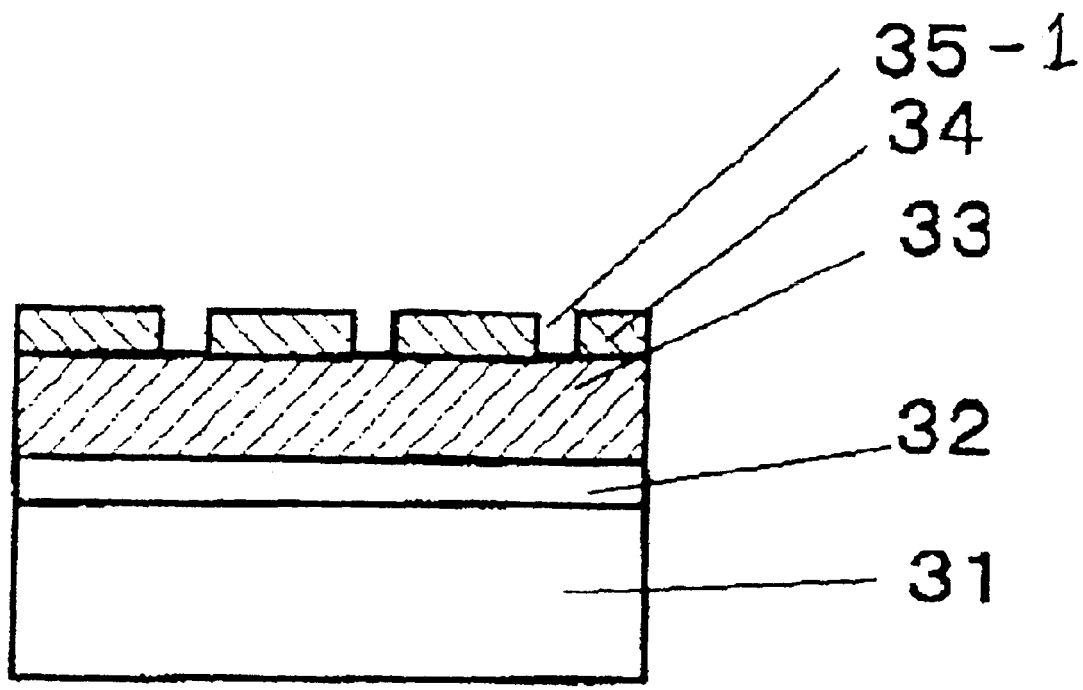

With reference to FIG. 6B, a thermal chemical vapor deposition was carried out by use of silane ($SiH_4$) and oxygen ($O_2$) to deposit a $SiO_2$ film 33 having a thickness of 4 micrometers on the AlN base layer 32. The thermal chemical vapor deposition was carried out under the following conditions. The temperature was 500° C. Nitrogen ($N_2$) was used as a carrier gas. A partial pressure of silane ($SiH_4$) was 4E-4 atm. A partial pressure of oxygen ($O_2$) was 4E-3 atm. A resist film 34 was applied on the $SiO_2$ film 33. An exposure and a subsequent development of the resist film 34 were carried out to form a resist pattern 34 having stripe-shaped openings 35-1. A longitudinal direction of the stripe-shaped openings 35-1 of the resist pattern 34 is [1–100] of the AlN base layer 32. The stripe-shaped openings 35-1 have a width of 2 micrometers. The stripe-shaped openings 35 are aligned at a constant pitch of 10 micrometers.

Figure 6C:
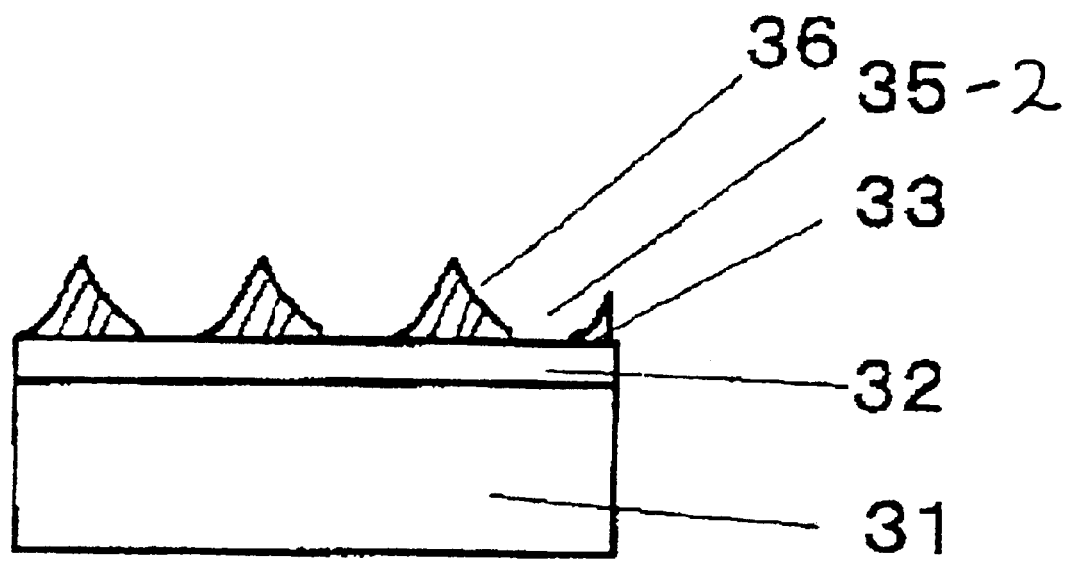

With reference to FIG. 6C, a wet etching process was carried out by use of a fluorine acid base etchant and the resist pattern 34 for selectively etching the $SiO_2$ film 33, whereby stripe-shaped openings 35-2 were formed in the $SiO_2$ film 33. As a result, an $SiO_2$ mask 36 with stripe-shaped openings 35-2 was prepared, wherein the stripe-shaped openings 35 are defined by sloped side walls of the $SiO_2$ mask 36. The stripe-shaped openings 35-2 of the $SiO_2$ mask 36 have a width of 2 micrometers at the bottom level of the $SiO_2$ mask 36. The used resist pattern 34 was then removed.

Figure 6D:
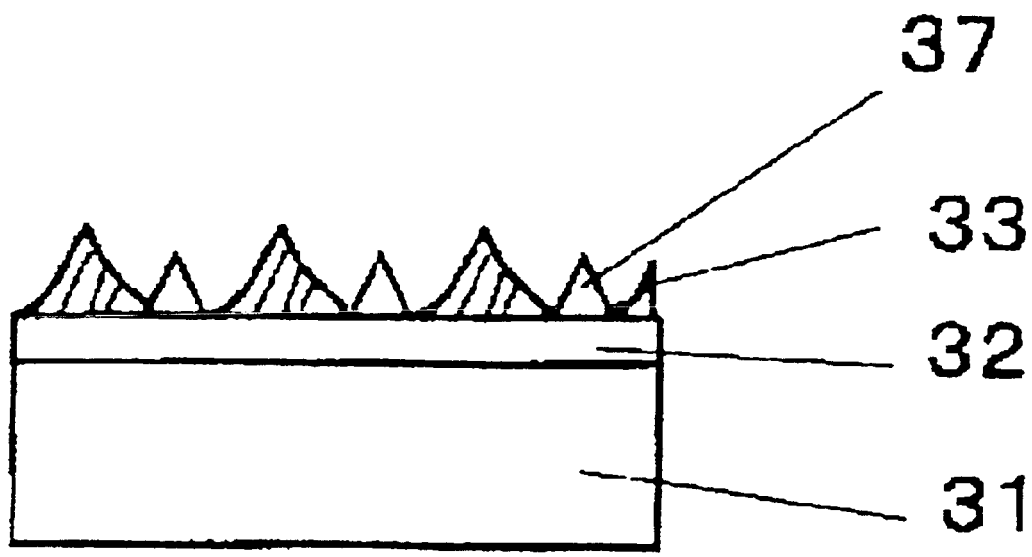
Figure 6E:
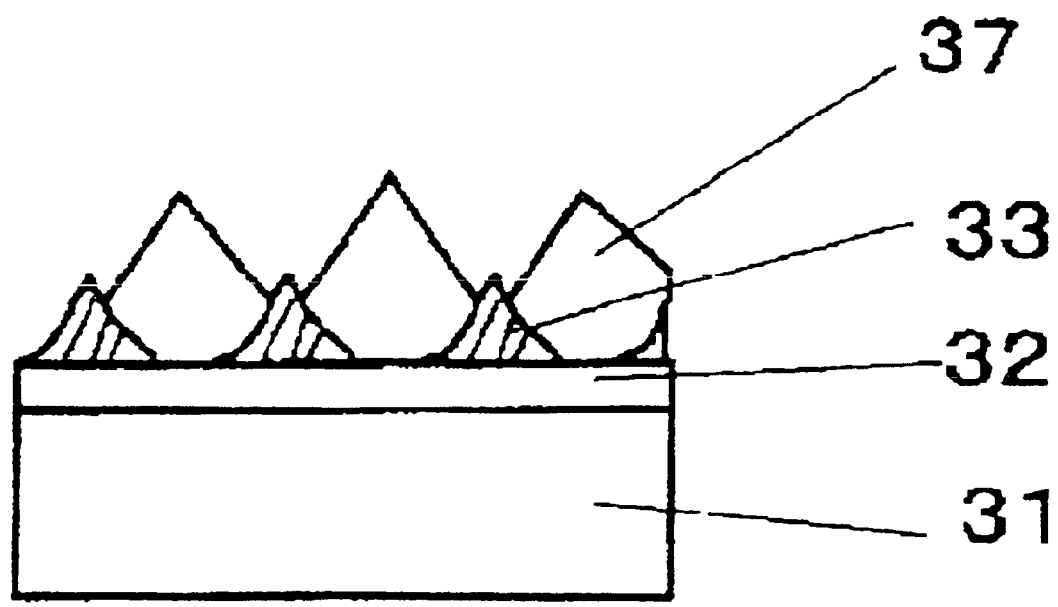
Figure 6F:
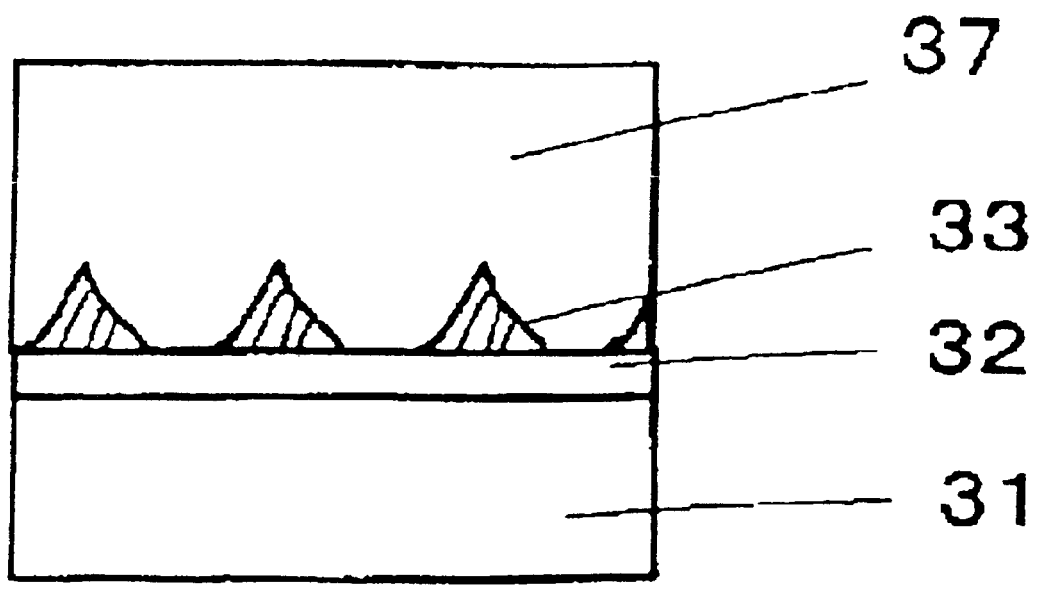

With reference to FIGS. 6D, 6E and 6F, a GaN layer 37 was grown over the AlN base layer 32 by a hydride vapor phase epitaxy (HVPE) using the $SiO_2$ mask 36 with the stripe-shaped openings 35-2 by supplying gallium chloride (GaCl) and $NH_3$. The hydride vapor phase epitaxy (HVPE) is one of the facet-initiated epitaxial lateral over growth. The hydride vapor phase epitaxy (HVPE) was carried out as follows. The silicon substrate 31 was placed in a growth chamber of a hydride vapor phase epitaxy system. During when a hydrogen gas and an ammonium gas are supplied, and also a temperature was increased up to 1000° C., wherein the supply of the ammonium gas under a partial pressure of 0.3 atm. was started when the temperature reaches 600° C.

After the temperature of the growth area has become stable, then the supply of GaCl was started to grow the GaN film 37, wherein a partial pressure of HCl was 1.5E-2 atm. In the initial growth process, the GaN layer 37 is epitaxially grown from the growth areas of the AlN base layer 32 defined by the openings 35-2 of the mask 36. Facet structures were formed over the growth areas and in the openings 35-2 of the mask 36. The epitaxial growth was continued, wherein the GaN layer 37 with the facet structures over the mask 36 was grown as shown in FIG. 6E. The epitaxial growth was still continued, and the facet structures became large in size and adjacent two of the facet structures became united. The epitaxial growth was still continued, and the GaN layer 37 became having a flat surface as shown in FIG. 6F. The epitaxial growth for 65 hours formed the GaN epitaxial layer 37 having a thickness of 600 micrometers.

After the epitaxial growth of the GaN epitaxial layer 37 was completed, then the temperature was decreased by supplying $NH_3$ gas, hydrogen gas and nitrogen gas. When the temperature dropped to about 600° C., the supply of the $NH_3$ gas was discontinued. The temperature was then further dropped to the ordinary temperature, so that the used gases in the growth chamber were replaced by the nitrogen gas prior to having picked up the substrate.

The silicon substrate 31 was removed by a mixing solution of nitric acid and fluorine acid to have obtained a single layered structure of the GaN epitaxial layer 37, The GaN epitaxial layer 37 was then observed by an interference microscope. It was confirmed that the GaN epitaxial layer 37 has a highly flat surface. It was also confirmed that the GaN epitaxial layer 37 exhibits an n-type conductivity, and a carrier concentration of 5E16 $cm^{-3}$ at the ordinary temperature. It was also confirmed that the GaN epitaxial layer 37 has a Hall-mobility of 700 $cm^2$/Vs. An etch-pit density of the surface of the GaN epitaxial layer 37 was measured using a phosphate-based solution. The measured etch-pit density was not more than 6E6 $cm^{-2}$. An X-ray diffraction by a (0002)-face of the surface of the GaN epitaxial layer 37 was carried out. It was confirmed that a half width of the X-ray diffraction is 100 seconds which means that the tilt angle is 100 seconds.

In this embodiment, the silicon substrate was used for growing the GaN epitaxial layer 37. Any other available materials for growing the GaN epitaxial layer 37 may be selected as the substrate material, such as a langaside ($La_3Ga_5SiO_{14}$) substrate, a SiC substrate, a substrate with a metal thin of not more than 100 nanometers in thickness and a GaAs substrate.

Fourth Embodiment:

The subject matter of the fourth embodiment of the present invention has been described with reference to FIG. 3D, particularly focusing on the mechanisms of how the dislocations are blocked or terminated by the improved mask. The fourth embodiment according to the present invention will be described again in more detail with reference to the drawings. FIGS. 7A through 7F are fragmentary cross sectional elevation views of the semiconductor substrates in sequential steps involved in a novel formation method in the fourth embodiment in accordance with the present invention.

Figure 7A:
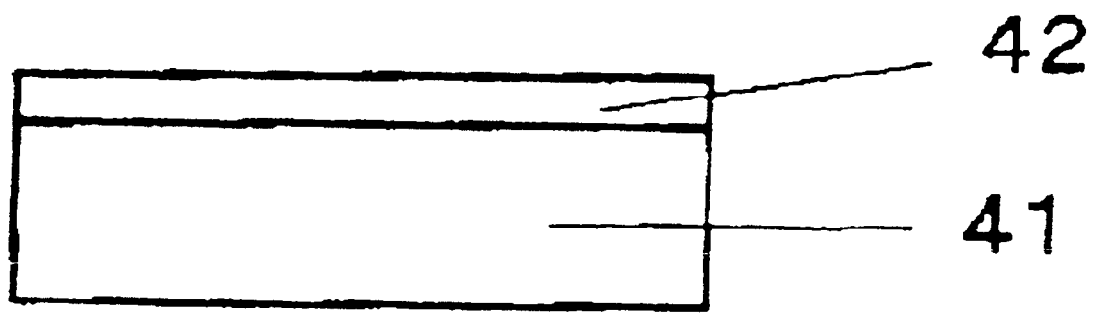
FIGS. 7A through 7F are fragmentary cross sectional elevation views of the semiconductor substrates in sequential steps involved in a novel formation method in the fourth embodiment in accordance with the present invention.

With reference to FIG. 7A, a sapphire substrate 41 with a (1000)-face was prepared. The (1000)-face of the sapphire substrate 41 was cleaned. A GaN base layer 42 having a thickness of 2 micrometers was grown on the (1000)-face of the sapphire substrate 41 by a metal organic vapor phase epitaxy. This metal organic vapor phase epitaxy was carried out as follows. The sapphire substrate 41 was heated up to a temperature of 1050° C. in an atmosphere comprising a hydrogen gas only or another atmosphere comprising the hydrogen gas and a nitrogen gas, so that a heat treatment was carried out for about 10 minutes. After the heat treatment, then the temperature of the sapphire substrate 41 was decreased to 500° C., so that trimethyl gallium (TMG) was supplied at a flow rate of 10 micro-mol/minute and an ammonium gas ($NH_3$) was supplied at a flow rate of 4000 cc/minute, whereby a GaN layer having a thickness of 30 nanometers was formed on the (1000)-face of the sapphire substrate 41. During supplying an ammonium gas, a hydrogen gas and a nitrogen gas, the temperature of the sapphire substrate 41 was increased up to a temperature of 1050° C. After the temperature of 1050° C. of the sapphire substrate 41 became stable, trimethyl gallium (TMG) was supplied at a flow rate of 40 micro-mol/minute, whereby the GaN base layer 42 having the thickness of 2 micrometers was grown.

Figure 7B:
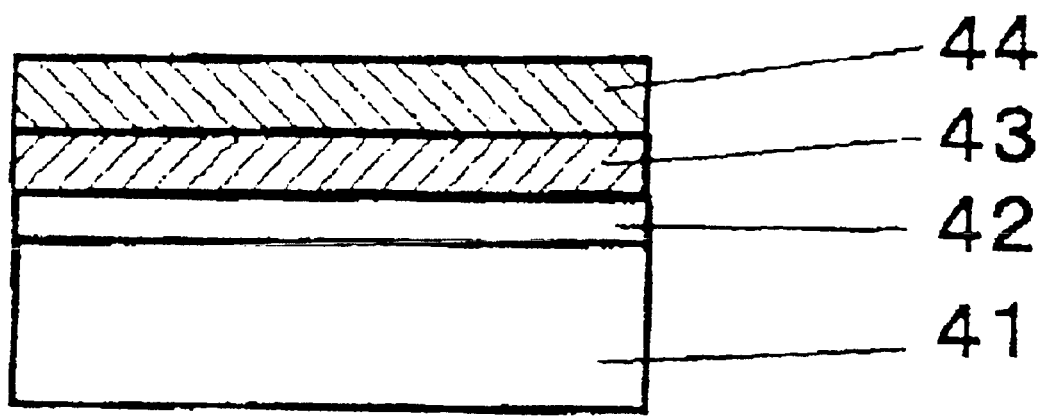

With reference to FIG. 7B, a thermal chemical vapor deposition was carried out by use of silane ($SiH_4$) and oxygen ($O_2$) to deposit a $SiO_2$ film 43 having a thickness of 2 micrometers on the GaN base layer 42. The thermal chemical vapor deposition was carried out under the following conditions. The temperature was 500° C. Nitrogen ($N_2$) was used as a carrier gas. A partial pressure of silane ($SiH_4$) was 4E-4 atm. A partial pressure of oxygen ($O_2$) was 4E-3 atm. A plasma-enhanced chemical vapor deposition was carried out by use of silane ($SiH_4$) and ammonium gas ($NH_3$) to deposit an SiN film 44 having a thickness of 2 micrometers on the $SiO_2$ film 43. As a result, the laminations of the $SiO_2$ film 43 and the SiN film 44 were formed on the GaN base layer 42. The plasma-enhanced chemical vapor deposition was carried out under the following conditions. The temperature was 300° C. A flow rate of silane ($SiH_4$) was 175 cc/min. A flow rate of ammonium gas ($NH_3$) was 100 cc/min. An internal pressure of the deposition chamber of the plasma enhanced chemical vapor deposition system was 130 Pa. After the deposition of the SiN film 44 was completed, then the internal pressure was increased to the ordinary pressure, and the used gases in the deposition chamber were replaced by the nitrogen gas. The substrate 41 was then picked out from the deposition chamber.

Figure 7C:
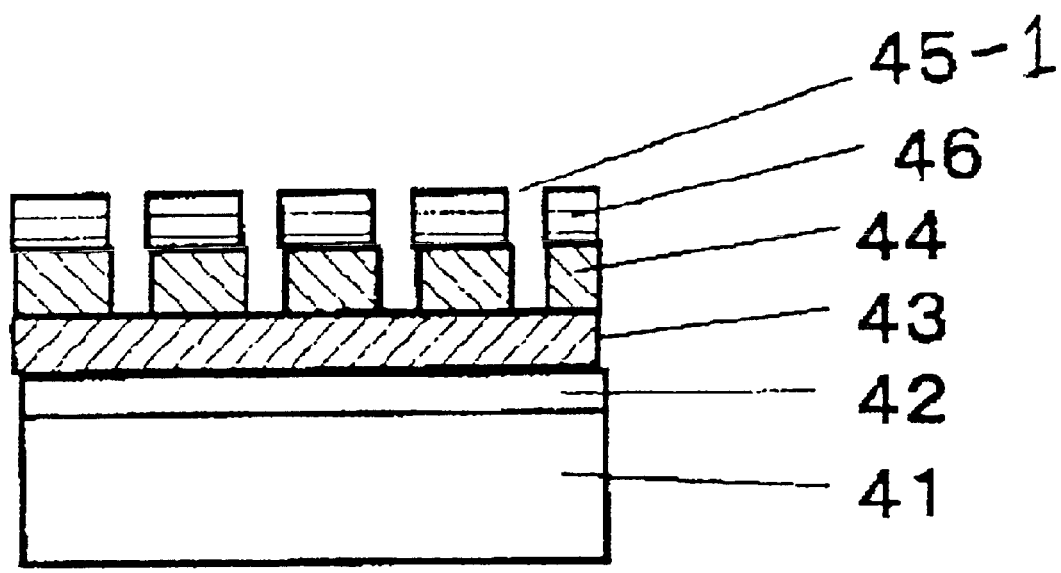

With reference to FIG. 7C, a resist film was applied on the SiN film 44. An exposure and a subsequent development of the resist film were carried out to form a resist pattern having stripe-shaped openings. A reactive ion etching process was carried out by use of $CF_4$ gas for selectively etching the SiN film 44 only, whereby stripe-shaped openings 45-1 were formed in the SiN film 44. The stripe-shaped openings 45 are defined by vertical side walls of the SiN film 44. A longitudinal direction of the stripe-shaped openings 45-1 is tilted by 10 degrees from [1–100] of the GaN base layer 42. The stripe-shaped openings 45-1 have a width of 1 micrometers. The stripe-shaped openings 45-1 are aligned at a constant pitch of 6 micrometers.

Figure 7D:
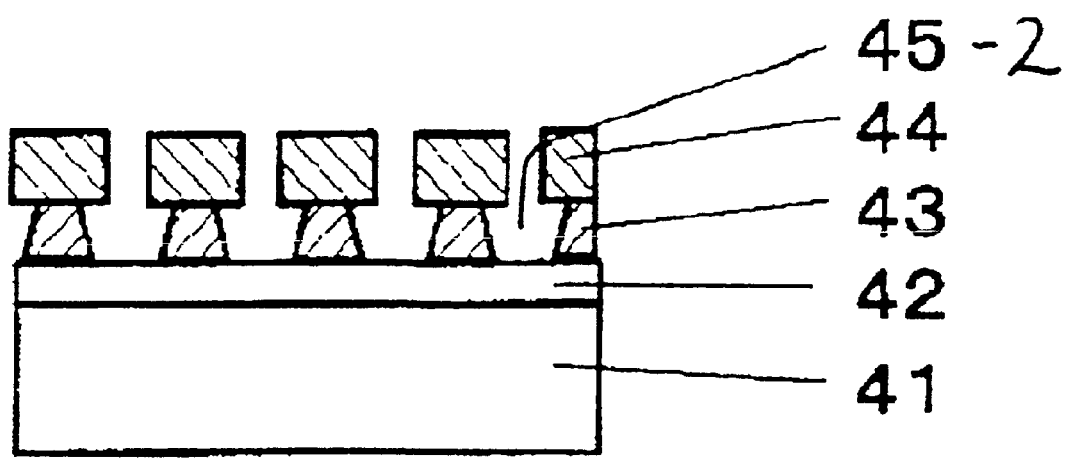

With reference to FIG. 7D, a wet etching process was carried out by use of a fluorine acid based etchant for selectively etching the $SiO_2$ film 43 only, whereby stripe-shaped openings 45-2 were formed in the $SiO_2$ film 43. The stripe-shaped openings 45-2 are defined by sloped side walls of the $SiO_2$ film 43. A longitudinal direction of the stripe-shaped openings 45-2 is tilted by 10 degrees from [1–100] of the GaN base layer 42. The stripe-shaped openings 45-2 have a width of 2 micrometers at the bottom level of the $SiO_2$ film 43. The stripe-shaped openings 45-2 are aligned at a constant pitch of 6 micrometers. The combinations of the stripe-shaped openings 45-1 of the SiN film 44 and the stripe-shaped openings 45-2 of the $SiO_2$ film 43 form stripe-shaped openings 45 of the double layered mask which comprises the $SiO_2$ film 43 and the SiN film 44. The used resist pattern 46 was removed.

Figure 7E:
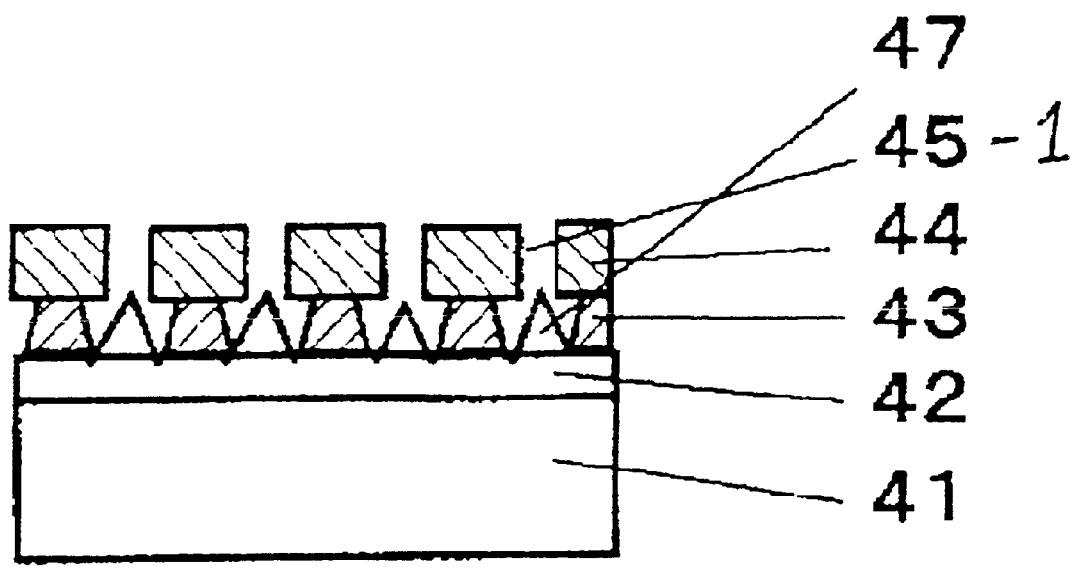

With reference to FIG. 7E, a GaN layer 47 was grown over the GaN base layer 42 by a hydride vapor phase epitaxy (HVPE) using the double layered mask comprising the $SiO_2$ film 43 and the SiN film 44 with the stripe-shaped openings 45 by supplying gallium chloride (GaCl) and $NH_3$. The hydride vapor phase epitaxy (HVPE) is one of the facet-initiated epitaxial lateral over growth. The hydride vapor phase epitaxy (HVPE) was carried out as follows. The sapphire substrate 41 was placed in a growth chamber of a hydride vapor phase epitaxy system. During when a hydrogen gas and an ammonium gas are supplied, and also a temperature was increased up to 1040° C., wherein the supply of the ammonium gas under a partial pressure of $NH_3$ at 0.4 atm. was started when the temperature reaches 600° C.

Figure 7F:
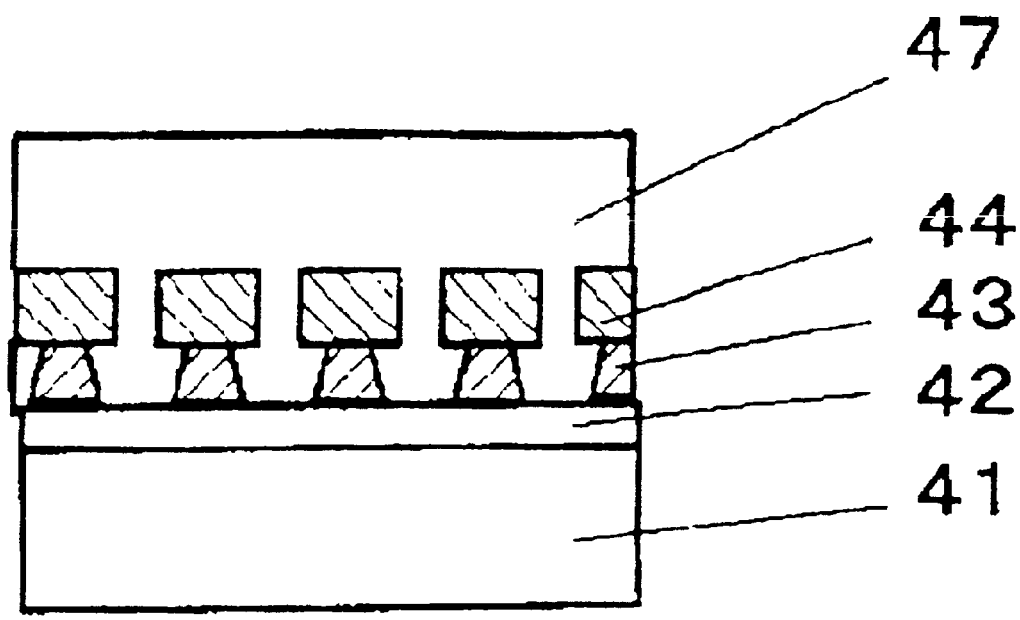

After the temperature of the growth area has become stable, then the supply of GaCl was started to grow the GaN film 47, wherein a partial pressure of HCl was 5E-3 atm. In the initial growth process, the GaN layer 47 is epitaxially grown from the growth areas of the GaN base layer 42 defined by the openings 45 of the double layered mask comprising the $SiO_2$ film 43 and the SiN film 44. Facet structures were formed over the growth areas and in the openings 45 of the double layered mask. The epitaxial growth was continued, wherein the GaN layer 47 with the facet structures over the double layered mask was grown. The epitaxial growth was still continued, and the facet structures became large in size and adjacent two of the facet structures became united. The epitaxial growth was still continued, and the GaN layer 47 became having a flat surface as shown in FIG. 7F. The epitaxial growth for 10 hours formed the GaN epitaxial layer 47 having a thickness of 400 micrometers.

After the epitaxial growth of the GaN epitaxial layer 47 was completed, then the temperature was decreased by supplying $NH_3$ gas, hydrogen gas and nitrogen gas. When the temperature dropped to about 600° C., the supply of the $NH_3$ gas was discontinued. The temperature was then further dropped to the ordinary temperature, so that the used gases in the growth chamber were replaced by the nitrogen gas prior to having picked up the substrate.

The GaN epitaxial layer 47 was then observed by an interference microscope. It was confirmed that the GaN epitaxial layer 47 has a highly flat surface. It was also confirmed that the GaN epitaxial layer 47 exhibits an n-type conductivity, and a carrier concentration of $8E15$ $cm^{-3}$ at the ordinary temperature. It was also confirmed that the GaN epitaxial layer 47 has a Hall-mobility of 900 $cm^2/Vs$. After a passivation film was formed on the bottom surface of the substrate 41, then an etch-pit density of the surface of the GaN epitaxial layer 47 was measured using a phosphate-based solution. The measured etch-pit density was not more than $4E6$ $cm^{-2}$. An X-ray diffraction by a (0002)-face of the surface of the GaN epitaxial layer 47 was carried out. It was confirmed that a half width of the X-ray diffraction is 90 seconds which means that the tilt angle is 90 seconds.

In this embodiment, the $SiO_2$ film 43 was selectively removed by the wet etching. It is, however, possible that the $SiO_2$ film 43 is etched by the reactive ion etching by use of $CF_4$ gas to form stripe-shaped openings 45-2 with vertical side walls of the $SiO_2$ film 43 for subsequent wet etching to the vertical side walls of the $SiO_2$ film 43.

Fifth Embodiment:

The subject matter of the fifth embodiment of the present invention has been described with reference to FIG. 3E, particularly focusing on the mechanisms of how the dislocations are blocked or terminated by the improved mask. The fifth embodiment according to the present invention will be described again in more detail with reference to the drawings. FIGS. 8A through 8E are fragmentary cross sectional elevation views of the semiconductor substrates in sequential steps involved in a novel formation method in the fifth embodiment in accordance with the present invention.

Figure 8A:
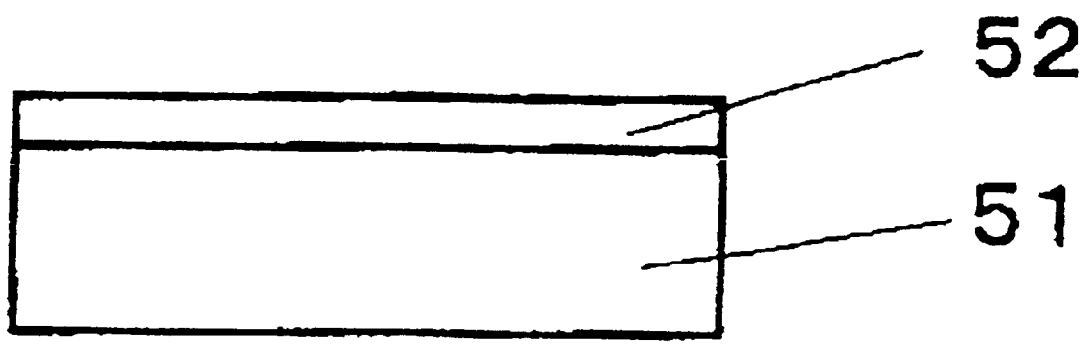
FIGS. 8A through 8E are fragmentary cross sectional elevation views of the semiconductor substrates in sequential steps involved in a novel formation method in the fifth embodiment in accordance with the present invention.

With reference to FIG. 8A, a sapphire substrate 51 with a (0001)-face was prepared. The (0001)-face of the sapphire substrate 51 was cleaned. A GaN base layer 52 having a thickness of 1 micrometer was grown on the (0001)-face of the sapphire substrate 51 by a metal organic vapor phase epitaxy. This metal organic vapor phase epitaxy was carried out as follows. The sapphire substrate 51 was heated up to a temperature of 1050° C. in an atmosphere comprising a hydrogen gas and a nitrogen gas, so that a heat treatment was carried out for about 10 minutes. After the heat treatment, then the temperature of the sapphire substrate 51 was decreased to 500° C., so that trimethyl gallium (TMG) was supplied at a flow rate of 10 micro-mol/minute and an ammonium gas ($NH_3$) was supplied at a flow rate of 4000 cc/minute, whereby a GaN layer having a thickness of 25 nanometers was formed on the (0001)-face of the sapphire substrate 51. During supplying an ammonium gas, a hydrogen gas and a nitrogen gas, the temperature of the sapphire substrate 51 was increased up to a temperature of 1030° C. After the temperature of 1030° C. of the sapphire substrate 51 became stable, trimethyl gallium (TMG) was supplied at a flow rate of 40 micro-mol/minute, whereby the GaN base layer 52 having the thickness of 1 micrometer was grown.

Figure 8B:
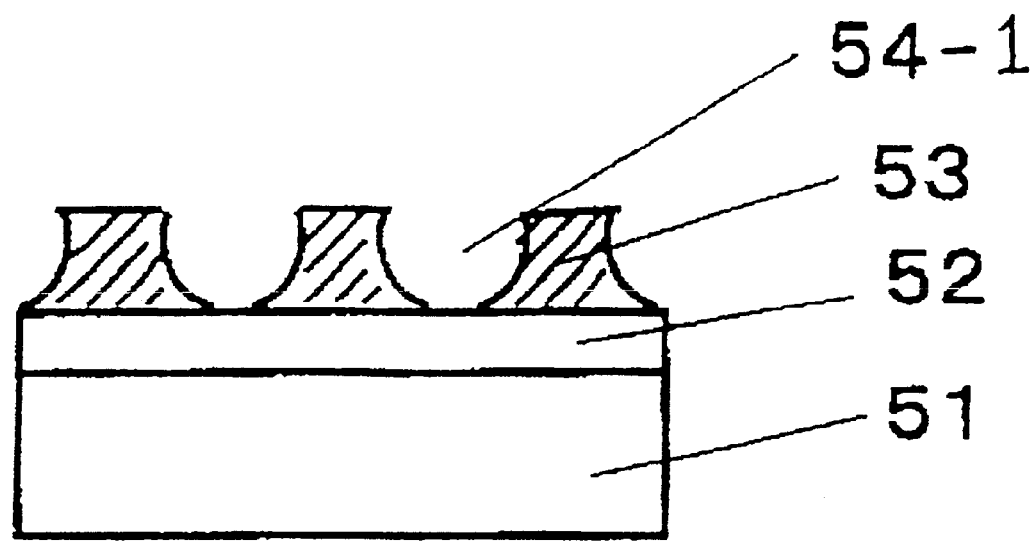

With reference to FIG. 8B, a thermal chemical vapor deposition was carried out by use of silane ($SiH_4$) and oxygen ($O_2$) to deposit a $SiO_2$ film 53 having a thickness of 4 micrometers on the GaN base layer 52. The thermal chemical vapor deposition was carried out under the following conditions. The temperature was 500° C. Nitrogen ($N_2$) was used as a carrier gas. A partial pressure of silane ($SiH_4$) was 4E-4 atm. A partial pressure of oxygen ($O_2$) was 4E-3 atm. A resist film was applied on the $SiO_2$ film 53. An exposure and a subsequent development of the resist film were carried out to form a resist pattern having stripe-shaped openings. A wet etching process was carried out by use of a fluorine acid based etchant for selectively etching the $SiO_2$ film 53, whereby stripe-shaped openings 54-1 were formed in the $SiO_2$ film 53. As a result, the $SiO_2$ mask 53 with the stripe-shaped openings 54-1 was prepared, wherein the stripe-shaped openings 54-1 are defined by sloped side walls of the $SiO_2$ mask 53. A longitudinal direction of the stripe-shaped openings 54-1 is [1–100] of the GaN base layer 52. The stripe-shaped openings 54-1 have a width of 2 micrometers. The stripe-shaped openings 54 are aligned at a constant pitch of 12 micrometers.

Figure 8C:
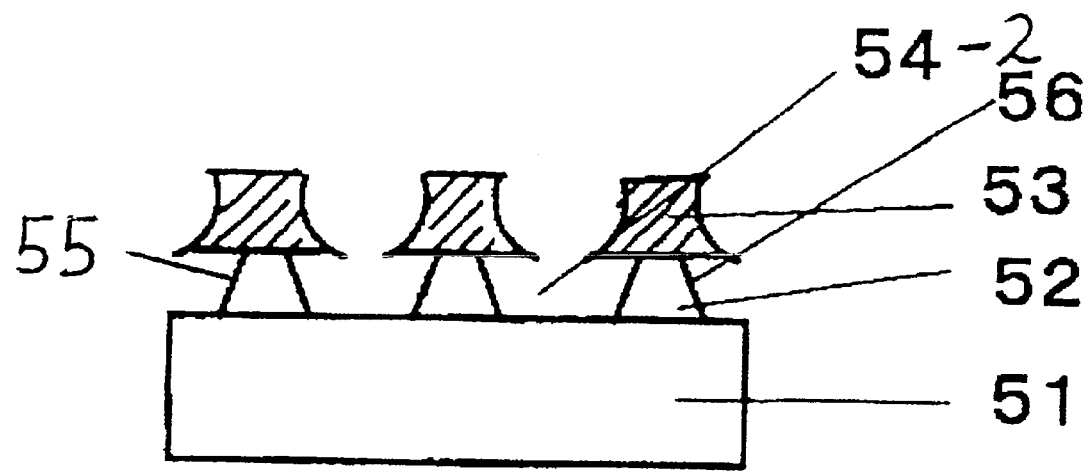

With reference to FIG. 8C, the $SiO_2$ mask 53 with the stripe-shaped openings 54-1 was used as a mask for having carried out a selective wet etching to the GaN base layer 52 by use of an etchant including a phosphoric acid and a sulfuric acid at a ratio of 1:1, whereby the GaN base layer 52 was selectively removed and parts of the bottom regions of the $SiO_2$ mask 53 were also removed. As a result, stripe-shaped openings 54-2 was formed in the GaN base layer 52, wherein the stripe-shaped openings 54-2 are defined by sloped side walls 55 of the GaN base layer 52. The GaN base layer 52 remained only under the $SiO_2$ mask 53 and parts of the surface of the sapphire substrate 51 were exposed. The above wet etching was carried out at a temperature of about 240° C.

Figure 8D:
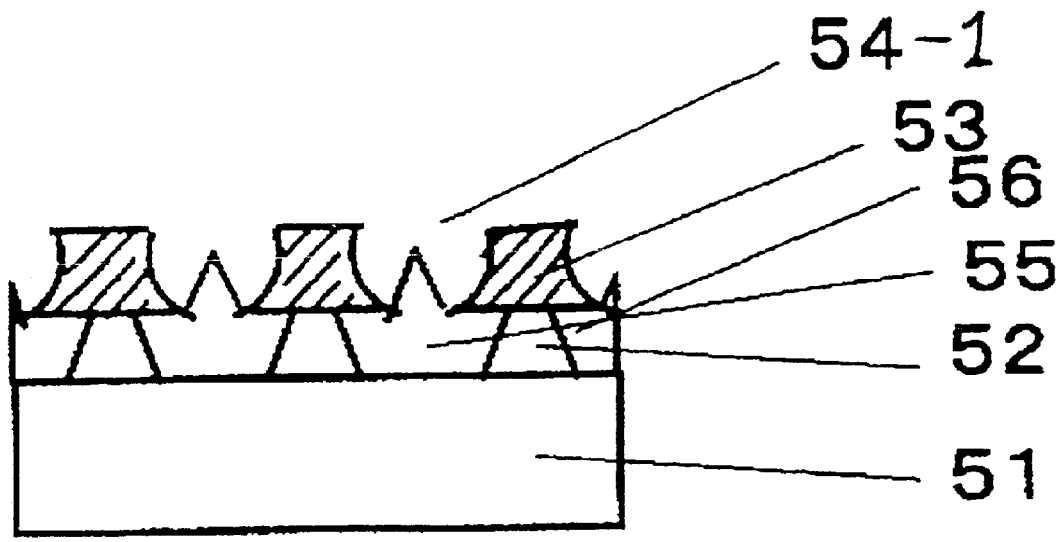

With reference to FIG. 8D, a GaN layer 55 was grown from the side walls 55 of the GaN base layer 52 by a hydride vapor phase epitaxy (HVPE) using the $SiO_2$ mask 53 with the stripe-shaped openings 54-1 by supplying gallium chloride (GaCl) and $NH_3$. The hydride vapor phase epitaxy (HVPE) is one of the facet-initiated epitaxial lateral over growth. The hydride vapor phase epitaxy (HVPE) was carried out as follows. The sapphire substrate 51 was placed in a growth chamber of a hydride vapor phase epitaxy system. During when a hydrogen gas and a nitrogen gas are supplied, and also a temperature was increased up to 1000° C., wherein the supply of the ammonium gas under a partial pressure of 0.4 atm was started when the temperature reaches 600° C.

Figure 8E:
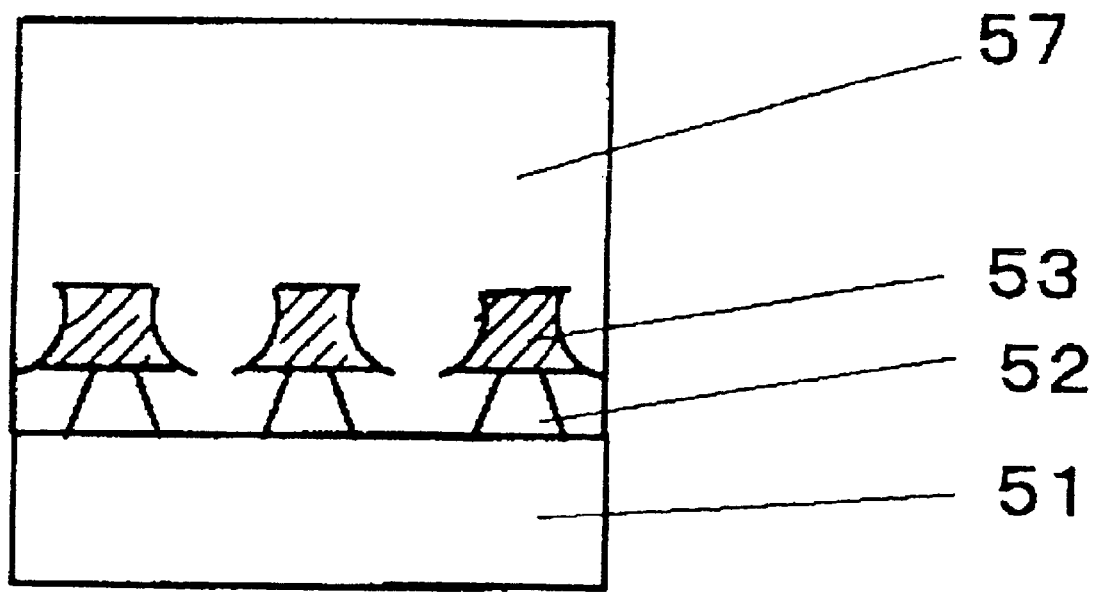

After the temperature of the growth area has become stable, then the supply of GaCl was started to grow the GaN film 55, wherein a partial pressure of HCl was 5E-3 atm. In the initial growth process, the GaN layer 55 is epitaxially grown from the side walls 55 of the GaN base layer 52 under the mask 53. Facet structures were formed in the openings 54-1 of the mask 53, whereby a GaN film 56 with the facet structures was formed as shown in FIG. 8D. The epitaxial growth was continued, wherein the GaN layer 56 with the facet structures over the mask 53 was grown. The epitaxial growth was still continued, and the facet structures became large in size and adjacent two of the facet structures became united. The epitaxial growth was still continued, and a GaN layer 57 having a flat surface was formed as shown in FIG. 8E. The epitaxial growth for 65 hours formed the GaN epitaxial layer 57 having a thickness of 300 micrometers.

After the epitaxial growth of the GaN epitaxial layer 57 was completed, then the temperature was decreased by supplying $NH_3$ gas and hydrogen gas. When the temperature dropped to about 600° C., the supply of the $NH_3$ gas was discontinued. The temperature was then further dropped to the ordinary temperature, so that the used gases in the growth chamber were replaced by the nitrogen gas prior to having picked up the substrate. The sapphire substrate 51 was removed by a laser peeling method to have obtained a single layered structure of the GaN epitaxial layer 57.

The GaN epitaxial layer 57 was then observed by an interference microscope. It was confirmed that the GaN epitaxial layer 57 has a highly flat surface. It was also confirmed that the GaN epitaxial layer 57 exhibits an n-type conductivity, and a carrier concentration of $1E16$ $cm^{-3}$ at the ordinary temperature. It was also confirmed that the GaN epitaxial layer 57 has a Hall-mobility of 800 $cm^2/Vs$. An etch-pit density of the surface of the GaN epitaxial layer 57 was measured using a phosphate-based solution. The measured etch-pit density was not more than $4E6$ $cm^{-2}$. An X-ray diffraction by a (0002)-face of the surface of the GaN epitaxial layer 57 was carried out. It was confirmed that a half width of the X-ray diffraction is 110 seconds which means that the tilt angle is 110 seconds.

In this embodiment, the silicon substrate was used for growing the GaN epitaxial layer 37. Any other available materials for growing the GaN epitaxial layer 37 may be selected as the substrate material, such as a langaside ($La_3Ga_5SiO_{14}$) substrate, a SiC substrate, and a GaAs substrate.

Sixth Embodiment:

The subject matter of the sixth embodiment of the present invention has been described with reference to FIG. 3F, particularly focusing on the mechanisms of how the dislocations are blocked or terminated by the improved mask. The sixth embodiment according to the present invention will be described again in more detail with reference to the drawings. FIGS. 9A through 9E are fragmentary cross sectional elevation views of the semiconductor substrates in sequential steps involved in a novel formation method in the sixth embodiment in accordance with the present invention.

Figure 9A:
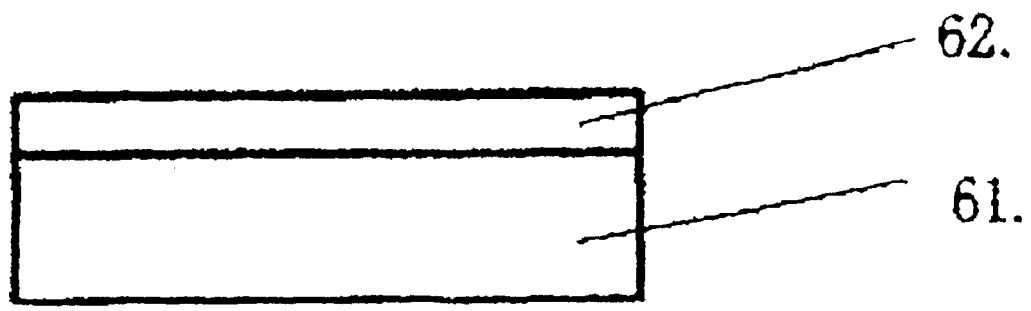
FIGS. 9A through 9E are fragmentary cross sectional elevation views of the semiconductor substrates in sequential steps involved in a novel formation method in the sixth embodiment in accordance with the present invention.

With reference to FIG. 9A, a sapphire substrate 61 with a (0001)-face face was prepared. The (0001)-face of the sapphire substrate 61 was cleaned. A GaN base layer 62 having a thickness of 2 micrometers was grown on the (0001)-face of the sapphire substrate 61 by a metal organic vapor phase epitaxy. This metal organic vapor phase epitaxy was carried out as follows. The sapphire substrate 61 was heated up to a temperature of 1050° C. in an atmosphere comprising a hydrogen gas and a nitrogen gas, so that a heat treatment was carried out for about 10 minutes. After the heat treatment, then the temperature of the sapphire substrate 61 was decreased to 500° C., so that trimethyl gallium (TMG) was supplied at a flow rate of 10 micro-mol/minute and an ammonium gas ($NH_3$) was supplied at a flow rate of 4000 cc/minute, whereby a GaN layer having a thickness of 30 nanometers was formed on the (0001)-face of the sapphire substrate 61. During supplying an ammonium gas, a hydrogen gas and a nitrogen gas, the temperature of the sapphire substrate 61 was increased up to a temperature of 1050° C. After the temperature of 1050° C. of the sapphire substrate 61 became stable, trimethyl gallium (TMG) was supplied at a flow rate of 40 micro-mol/minute, whereby the GaN base layer 62 having the thickness of 2 micrometers was grown.

Figure 9B:
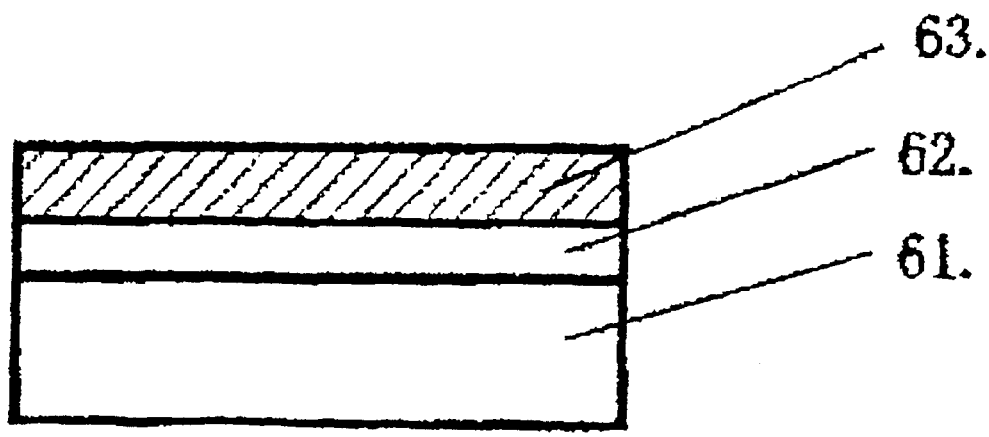
Figure 9C:
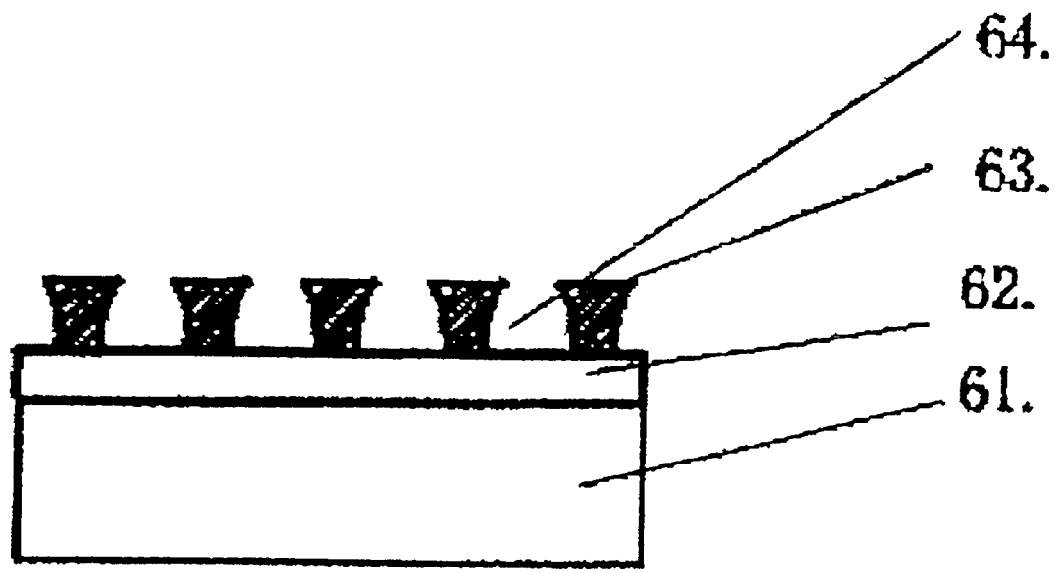

With reference to FIG. 9B, a thermal chemical vapor deposition was carried out by use of silane ($SiH_4$) and oxygen ($O_2$) to deposit a $SiO_2$ film 63 having a thickness of 4 micrometers on the GaN base layer 62. The thermal chemical vapor deposition was carried out under the following conditions. The temperature was gradually increased from 350° C. to 600° C. Nitrogen ($N_2$) was used as a carrier gas. A partial pressure of silane ($SiH_4$) was 4E-4 atm. A partial pressure of oxygen ($O_2$) was gradually decreased from 8E-3 atm to 8E-4 atm. A resist film was applied on the $SiO_2$ film 63. An exposure and a subsequent development of the resist film were carried out to form a resist pattern having stripe-shaped openings. A wet etching process was carried out for selectively etching the $SiO_2$ film 63, whereby stripe-shaped openings 64 were formed in the $SiO_2$ film 63. As a result, the $SiO_2$ mask 63 with the stripe-shaped openings 64 was prepared, wherein the stripe-shaped openings 64 are defined by inversely sloped side walls of the $SiO_2$ mask 63. A longitudinal direction of the stripe-shaped openings 64 is tilted by 10 degrees from [11–20] of the GaN base layer 62. The stripe-shaped openings 64 have a width of 1.5 micrometers at the bottom level of the $SiO_2$ mask 63. The stripe-shaped openings 64 are aligned at a constant pitch of 5 micrometers. The etching rate to the $SiO_2$ mask 63 increases from the upper region of the $SiO_2$ mask 63 to the lower region thereof, wherein a difference in etching rate is about 3 times, for which reason, the stripe-shaped openings 64 have inversely sloped side walls as shown in FIG. 9C.

Figure 9D:
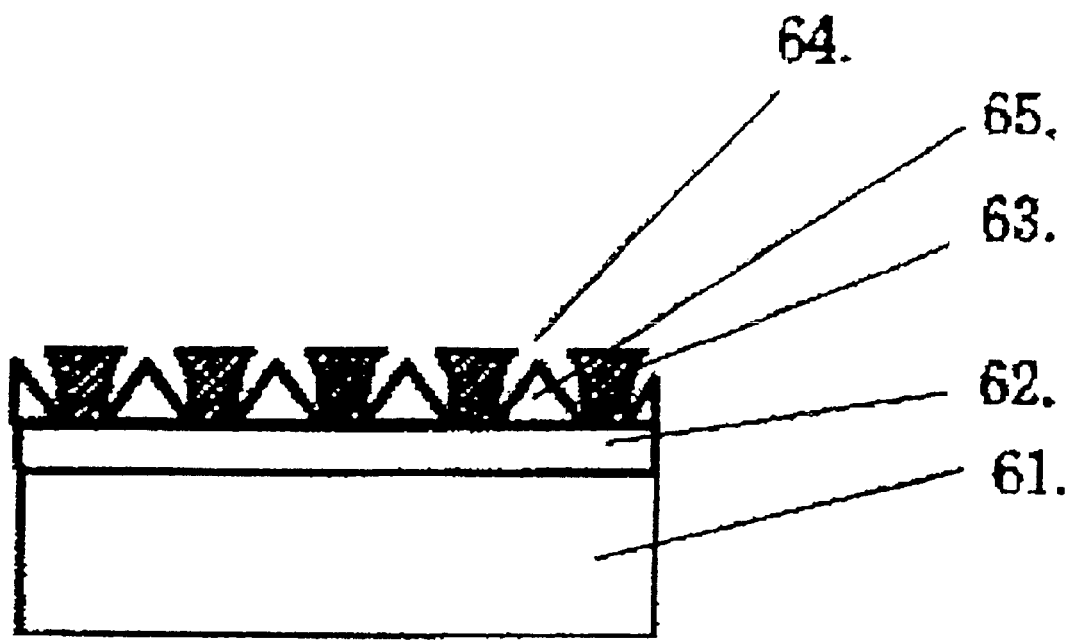

With reference to FIG. 9D, a GaN layer 65 was grown over the GaN base layer 62 by a metal organic vapor phase epitaxy (MOVPE) using the $SiO_2$ mask 63 with the stripe-shaped openings 64 by supplying gallium chloride (GaCl) and $NH_3$. The metal organic vapor phase epitaxy (MOVPE) is one of the facet-initiated epitaxial lateral over growth. The metal organic vapor phase epitaxy (MOVPE) was carried out as follows. The sapphire substrate 61 was placed in a growth chamber of a metal organic vapor phase epitaxy system. During when a hydrogen gas and an ammonium gas are supplied, and also a temperature was increased up to 1050° C., wherein the supply of the ammonium gas at a flow rate of 5000 cc/min. was started when the temperature reaches about 600° C.

After the temperature of the growth area has become stable, then the supply of trimethyl gallium (TMG) at a flow rate of 40 micro-mol/min for 5 minutes was carried out to grow the GaN layer 65. In the initial growth process, the GaN layer 65 is epitaxially grown from the growth areas of the GaN base layer 62 defined by the openings 64 of the mask 63. Facet structures were formed over the growth areas and in the openings 64 of the mask 63.

Figure 9E:
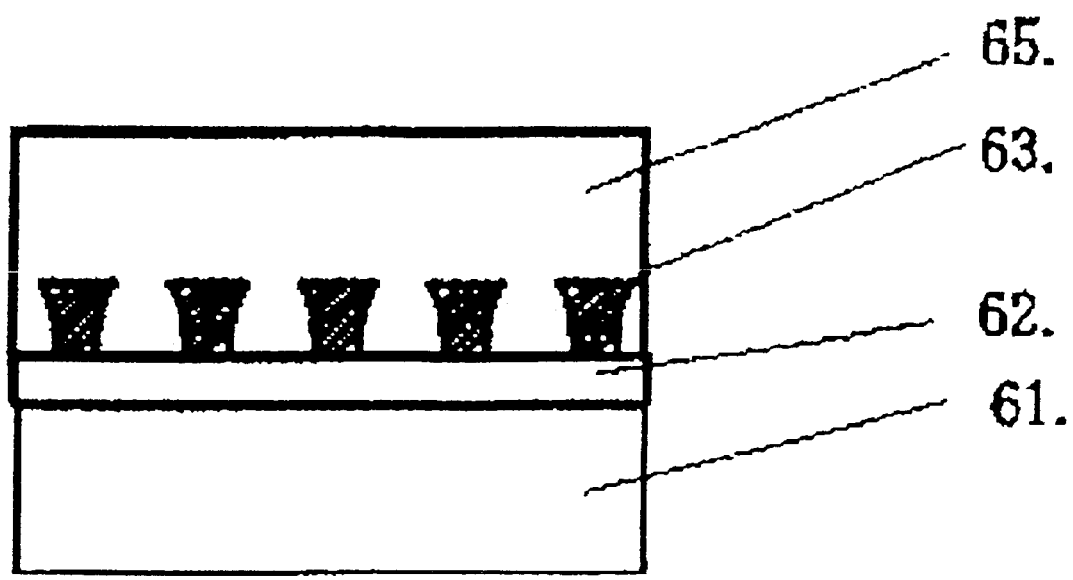

With reference to FIG. 9E, the epitaxial growth was continued, wherein the GaN layer 65 with the facet structures over the mask 63 was grown. The epitaxial growth was still continued, and the facet structures became large in size and adjacent two of the facet structures became united. The flow rate of trimethyl gallium (TMG) was increased to 150 micro-mol/minute and an additional supply of silane (SiH$_4$) gas as an n-type dopant gas at a flow rate of 1E-4 cc/min was started, so that the epitaxial growth was still continued, whereby the GaN layer 65 became having a flat surface. The epitaxial growth for 20 hours formed the GaN epitaxial layer 65 having a thickness of 100 micrometers.

After the epitaxial growth of the GaN epitaxial layer 65 was completed, then the temperature was decreased by supplying NH$_3$ gas and hydrogen gas. When the temperature dropped to about 600° C., the supply of the NH$_3$ gas was discontinued. The temperature was then further dropped to the ordinary temperature, so that the used gases in the growth chamber were replaced by the nitrogen gas prior to having picked up the substrate. The sapphire substrate 61 was removed by a laser irradiation to have obtained a single layered structure of the GaN epitaxial layer 65.

The GaN epitaxial layer 65 was then observed by an interference microscope. It was confirmed that the GaN epitaxial layer 65 has a highly flat surface. It was also confirmed that the GaN epitaxial layer 65 exhibits an n-type conductivity, and a carrier concentration of 1E186 cm$^{-3}$ at the ordinary temperature. It was also confirmed that the GaN epitaxial layer 65 has a Hall-mobility of 200 cm$^2$/Vs. An etch-pit density of the surface of the GaN epitaxial layer 65 was measured using a phosphate-based solution. The measured etch-pit density was not more than 5E6 cm$^{-2}$. An X-ray diffraction by a (0002)-face of the surface of the GaN epitaxial layer 65 was carried out. It was confirmed that a half width of the X-ray diffraction is 100 seconds which means that the tilt angle is 100 seconds.

Evaluations:

The following table 1 shows the mask thickness "h", the mask opening width "w" and the thickness of the GaN epitaxial layer over the mask in each of the above first to sixth embodiments.

TABLE 1

|  | Mask thickness "h" ($\mu$m) | Opening width "w" ($\mu$m) | GaN layer thickness ($\mu$m) |
|---|---|---|---|
| Ex. 1 | 4 | 2 | 200 |
| Ex. 2 | 4 | 2 | 450 |
| Ex. 3 | 4 | 2 | 600 |
| Ex. 4 | 2(SiO$_2$) 2(SiN) | 2 | 400 |
| Ex. 5 | 4 | 2 | 300 |
| Ex. 6 | 4 | 1.5 | 100 |

In each of the first to sixth embodiments, the mask satisfies the equation (1):

$$h \geq (w/2)\tan\theta \quad (1)$$

where "θ" is a base angle of the facet structure of the GaN epitaxial layer; "h" is the thickness of the mask; and "w" is the opening width of the mask at its lower level, and the opening width is defined in a direction included in a plane which is vertical to both the surface of the base layer and the side face of the facet structure.

The following table 2 shows the tilt angle, the twist angle, the dislocation density, and the Hall-mobility of the uppe region of the GaN epitaxial layer in each of the above first to sixth embodiments.

TABLE 2

|  | tilt angle (seconds) | twist angle (seconds) | dislocation (cm-2) | mobility (cm2/Vs) |
|---|---|---|---|---|
| Ex. 1 | 100 | 50 | 5E6 | 800 |
| Ex. 2 | 100 | — | 5E6 | 300 |
| Ex. 3 | 100 | — | 6E6 | 700 |
| Ex. 4 | 90 | — | 4E6 | 900 |
| Ex. 5 | 110 | — | 4E6 | 800 |
| Ex. 6 | 100 | — | 5E6 | 2800 |
| ABLEG. | 175 | — | — | — |
|  | 138 | — | — | — |
| ELO. | 180 | — | — | — |
|  | 360 | — | — | — |
| PENDEO. (1) | 264 | — | — | — |
|  | 176 | — | — | — |
| PENDEO. (2) | 205 | — | — | — |
|  | 205 | — | — | — |
| PENDEO. (3) | 176 | — | — | — |
|  | 176 | — | — | — |

ABLEG: Matsushita Electric; I. Kodouchi HI et al., 2000, Applied Physics Letters, vol. 76, p. 3768
ELO: UCSB; P. Fini et al., 2000, Applied Physics Letters, vol. 75, p. 1706
PENDEO: Sony; S. Tomiya et al., 2000, Applied Physics Letters, vol. 77, p. 636

The first to sixth embodiments are much lower in tilt angle than the known techniques. This means that the use of the above described mask satisfying the equation (1) is effective to reduce the tilt angle and the twist angle.

In the above described first to sixth embodiments, the shape of the opening of the mask was stripe. But the shape of the mask may be optional. A rectangle-shape, a circular-shape and an oval shape may be available as the shape of the opening of the mask, even the stripe-shape is preferable as the shape of the opening of the mask for easy formation of the facet structure.

Figure 10:
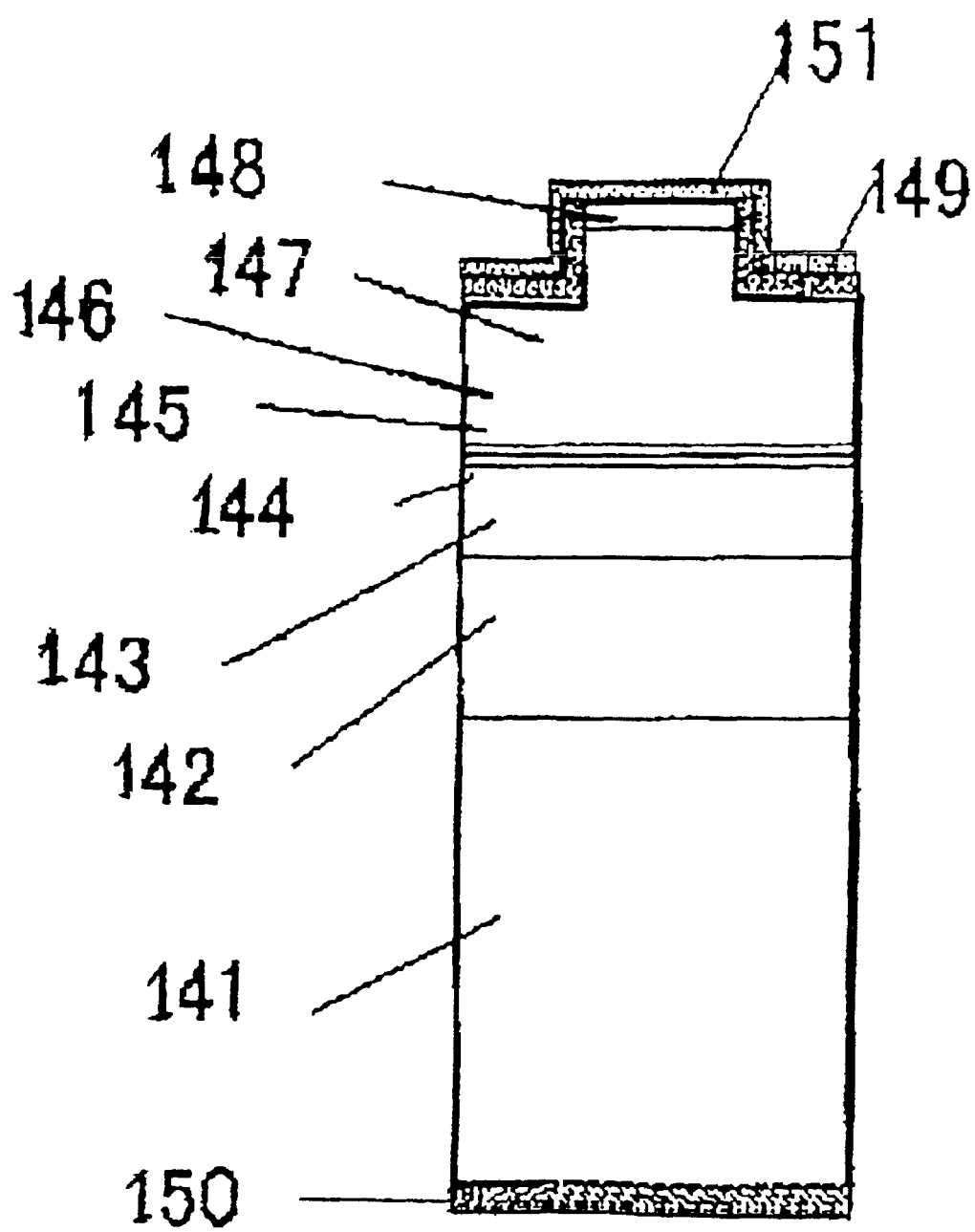
FIG. 10 is a cross sectional elevation view of a semiconductor laser device of the seventh embodiment in accordance with the present invention.

Seventh Embodiment:

The seventh embodiment according to the present invention will be described again in detail with reference to the drawings. FIG. 10 is a cross sectional elevation view of a semiconductor laser device of the seventh embodiment in accordance with the present invention, wherein the semiconductor laser device is provided on a substrate structure prepared in the same manner as in the first embodiment except that dichlorosilane was supplied as an n-type dopant in the hydride vapor phase epitaxy. An n-GaN substrate 141 was prepared which has a doping concentration of 5E17 cm$^{-2}$. The n-GaN substrate 141 has a tilt angle of 90 seconds, and a twist angle of 45 seconds. The n-GaN substrate 141 also has an electron mobility of 1000 cm$^2$/Vs.

The n-GaN substrate 141 was placed into a deposition chamber of a low pressure metal organic chemical vapor deposition system. The deposition chamber has a low pressure of 200 hPa. A low pressure metal organic chemical vapor deposition was carried out to form the following multilayer structure over the n-GaN substrate 141. Trimethyl gallium (TMG), trimethyl aluminum (TMA), and trimethyl indium (TMI) were used for the source materials of gallium (Ga), aluminum (Al), and indium (In) respectively.

An n-cladding layer 142 was deposited on the n-GaN substrate 141 by the low pressure metal organic chemical vapor deposition at a temperature of 1050° C., wherein the n-cladding layer 142 comprises an Si-doped n-Al$_{0.1}$Ga$_{0.9}$N layer having a thickness of 1.2 micrometers and a silicon concentration of 4E17 cm$^{-3}$. An n-type optical confinement layer 143 was deposited on the n-cladding layer 142 by the low pressure metal organic chemical vapor deposition at the temperature of 1050° C., wherein the n-type optical confinement layer 143 comprises an Si-doped n-GaN layer having a thickness of 0.1 micrometers and a silicon concentration of 4E17 cm$^{-3}$. A multiple quantum well layer 144 was deposited on the n-type optical confinement layer 143 by the low pressure metal organic chemical vapor deposition at a temperature of 780° C., wherein the multiple quantum well layer 144 comprises alternating laminations of three $In_{0.2}Ga_{0.8}N$ well layers having a thickness of 4 nanometers and S-doped n-$In_{0.05}Ga_{0.95}N$ potential barrier layers having a thickness of 6 nanometers and a silicon concentration of 5E18 cm$^{-3}$.

A cap layer 145 was deposited on the multiple quantum well layer 144 by the low pressure metal organic chemical vapor deposition at the temperature of 1050° C., wherein the cap layer 145 comprises an Mg-doped doped p-$Al_{0.2}Ga_{0.8}N$ layer. A p-type optical confinement layer 146 was deposited on the cap layer 145, wherein the p-type optical confinement layer 146 comprises an Mg-doped p-GaN layer having a thickness of 0.1 micrometers and a magnesium concentration of 2E17 cm$^{-3}$.

A p-cladding layer 147 was deposited on the p-type optical confinement layer 146 by the low pressure metal organic chemical vapor deposition at the temperature of 1050° C., wherein the p-cladding layer 147 comprises an Mg-doped p-$Al_{0.1}Ga_{0.9}N$ layer having a thickness of 0.5 micrometers and a magnesium concentration of 2E17 cm$^{-3}$. A p-contact layer 148 was deposited on the p-cladding layer 147 by the low pressure metal organic chemical vapor deposition at the temperature of 1050° C., wherein the p-contact layer 148 comprises an Mg-doped p-GaN layer having a thickness of 0.1 micrometers and a magnesium concentration of 2E17 cm$^{-3}$.

The p-contact layer 148 and the p-cladding layer 147 were selectively etched by a dry etching process to form a mesa structure. An $SiO_2$ insulating film 149 was formed on the top and side walls of the mesa structure and the base of the mesa structure. A resist film was applied on the $SiO_2$ insulating film 149. The resist film was then patterned by an exposure and a subsequent development. The resist pattern was used as a mask for selectively removing the $SiO_2$ insulating film 149, so that the top of the mesa structure was exposed, thereby forming a ridge structure with a width of 2 micrometers.

An n-type electrode 150 was formed on a bottom of the n-GaN substrate 141, wherein the n-type electrode 150 comprises laminations of a Ti-layer and an Al-layer. A p-type electrode 151 was formed on the top of the mesa structure or a top surface of the p-contact layer 148.

The device was then cleaved to form a cavity with a cavity length of 500 micrometers. I-L characteristic of the laser device was measured. It was confirmed that a threshold current is 25 mA, where a current density is 2.5 kA/cm$^2$. It was also confirmed that a slope efficiency is 1.1 W/A.

In this seventh embodiment, the substrate prepared in accordance with the first embodiment of the present invention was used for forming the semiconductor laser device. Any other substrates as prepared in accordance with any one of the second to sixth embodiments of the present invention would be available for forming the semiconductor laser device, provided that the upper region or the surface region of the substrate comprises the Group III-V compound semiconductor having a twist angle of not more than 50 seconds or a tilt angle of not more than 100 seconds.

COMPARATIVE EXAMPLE 1

The laser device having the same structure as in the seventh embodiment was formed on the conventional GaN substrate described with reference to FIGS. 1A through 1E. This comparative example 1 is the same as the seventh embodiment, except that the used substrate is different from the seventh embodiment. The conventional substrate used in this comparative example 1 has a tilt angle of 180 seconds and a twist angle of 210 seconds. This laser device was also cleaved to form a cavity with a cavity length of 500 micrometers. I-L characteristic of the laser device was measured. It was confirmed that a threshold current is 34 mA, where a current density is 3.4 kA/cm$^2$. It was also confirmed that a slope efficiency is 0.8 W/A. The laser device of this comparative example 1 is inferior in threshold current and slope efficiency than the laser device of the seventh embodiment of the present invention.

The present inventors considered that the improvements in the characteristics of the laser device of the seventh embodiment in accordance with the present invention are caused by reduced internal loss, for which reason an internal loss was measured based on the dependency of the slope efficiency onto the cavity length. The technique for measurement of the internal loss has been known. It was confirmed that the laser device of the comparative example 1 has an internal loss of 29 m$^{-1}$, whilst the laser device of the seventh embodiment of the present invention has an internal loss of 10 m$^{-1}$. The improvement in the crystal perfection of the substrate surface or upper region reduces the internal loss. The threshold current and the slope efficiency largely depend on the internal loss. The reduction in the internal loss results in the reduction in the threshold current and the increase in the slope efficiency, whereby a necessary driving current for a high output laser diode is reduced. The reduction in the driving current results in the increase in the life-time of the laser diode.

The comparison of the seventh embodiment of the present invention with the comparative example 1 shows that the reduction of the internal loss results in the improvements of the characteristics or performances of the laser diode. The first to sixth embodiments of the present invention show that the tilt angle and the twist angle were well reduced. The tilt angle and the twist angle mean that the GaN layer comprises micro-crystal grains which are slightly different in orientation from the exactly perfect crystal structure.

Japanese laid-open patent publication No. 11–251253 discloses a large reduction in blade-like dislocations in the substrate for large improvement of the characteristics or performances of the laser diode. The blade-like dislocations cause slightly tilted crystal grains which cause optical scattering in the active layer or the optical waveguide, resulting in a waveguide loss.

In the seventh embodiment of the present invention, the improvements of the laser diode are also caused by the reduction of the internal loss or the waveguide loss and also by the reduction of the optical scattering. The reductions of the tilt angle and the twist angle in accordance with the present invention were caused by mainly the fact that the most of the dislocations are blocked or terminated by the improved mask for the facet-initiated epitaxial lateral over growth and less dislocations propagate up to an upper region over the mask, rather than the reductions in the blade dislocations and the slightly tilted crystal grains.

In the prior art technique disclosed in Japanese laid-open patent publication No. 11–251253, the blade-like dislocations are changed in propagation direction from the vertical direction to the horizontal direction at the upper region over the mask, and excess crystal layers such as mono-atomic layers so called to as extra plane parallel to the mask are inserted into the upper region of the mask. The crystal structure over the inserted extra planes have the mosaic-crystal structure which has large tilt angle and large twist angle.

In accordance with the present invention, however, the extra planes are inserted into the crystal structure in the opening of the mask, and the dislocation loops are formed but confirmed only in the openings of the mask. The crystal imperfections, however, do not extend to the upper region over the mask, and the upper region over the mask has reduced tilt angle and twist angle.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor layered structure comprising:

a base material having a crystal structure;

a mask over said base material, and said mask having at least one opening defined by side walls, and said at least one opening further defining at least a growth area of a surface of said base material; and a Group III-V compound semiconductor epitaxial layer being directly on said at least growth area and said Group III-V compound semiconductor epitaxial layer completely burying said mask, wherein said Group III-V compound semiconductor epitaxial layer includes dislocations which extend substantially parallel to a thickness direction of said Group III-V compound semiconductor epitaxial layer, and at a facet face of a facet structure of said Group III-V compound semiconductor epitaxial layer, said dislocations turn substantially perpendicular to said thickness direction and are terminated by said side walls of said mask.

2. The semiconductor layered structure as claimed in claim 1, wherein said mask satisfies the equation (I):

$$h \geq (w/2)\tan\theta \quad (1)$$

where "θ" is a base angle of said facet structure; "h" is a thickness of said mask; and "w" is an opening width of said mask at its lower level, and said opening width is defined in a direction included in a plane which is vertical to both said surface of said base material and a side face of said facet structure.

3. The semiconductor layered structure as claimed in claim 1, wherein said Group III-V compound semiconductor layer comprises a nitride semiconductor including a Group III element.

4. The semiconductor layered structure as claimed in claim 1, wherein said base material has the same type of crystal structure as said Group III-V compound semiconductor layer.

5. The semiconductor layered structure as claimed in claim 1, wherein said opening of said mask has a stripe-shape with a longitudinal direction in the range of −10 degrees to +10 degrees from [1–100] of said base material.

6. The semiconductor layered structure as claimed in claim 1, wherein said opening of said mask has a stripe-shape with a longitudinal direction in the range of −10 degrees to +10 degrees from [11–20] of said base material.

7. The semiconductor layered structure as claimed in claim 1, wherein said thickness "h" of said mask is larger than a half of said opening width "w" thereof.

8. A semiconductor layered structure comprising:

a base material having a crystal structure;

a mask over said base material, and said mask having at least one opening defined by side walls, and said at least one opening further defining at least a growth area of a surface of said base material; and a Group III-V compound semiconductor epitaxial layer being directly on said at least growth area and said Group III-V compound semiconductor epitaxial layer completely burying said mask, wherein said mask satisfies the equation (1)

$$h \geq (w/2)\tan\theta \quad (1)$$

where "θ" is a base angle of a facet structure of said Group III-V compound semiconductor layer on said epitaxial growth; "h" is a thickness of said mask; and "w" is an opening width of said mask at its lower level, and said opening width is defined in a direction included in a plane which is vertical to bath said surface of said base material and a side face of said facet structure.

9. The semiconductor layered structure as claimed in claim 8, wherein said Group III-V compound semiconductor epitaxial layer includes dislocations which extend substantially parallel to a thickness direction of said Group III-V compound semiconductor epitaxial layer, and at a facet face of said facet structure, said dislocations turn substantially perpendicular to said thickness direction and are terminated by said side walls of said mask.

10. The semiconductor layered structure as claimed in claim 8, wherein said Group III-V compound semiconductor layer comprises a nitride semiconductor including a Group III element.

11. The semiconductor layered structure as claimed in claim 8, wherein said base material has the same type of crystal structure as said Group III-V compound semiconductor layer.

12. The semiconductor layered structure as claimed in claim 8, wherein said opening of said mask has a stripe-shape with a longitudinal direction in the range of −10 degrees to +10 degrees from [1 –100] of said base material.

13. The semiconductor layered structure as claimed in claim 8, wherein said opening of said mask has a stripe-shape with a longitudinal direction in the range of −10 degrees to +10 degrees from [11–20 ] of said base material.

14. The semiconductor layered structure as claimed in claim 8, wherein said thickness "h" of said mask is larger than a half of said opening width "w" thereof.

* * * * *